(12) United States Patent
Shida

(10) Patent No.: US 9,964,285 B2
(45) Date of Patent: May 8, 2018

(54) DISPLAY DEVICE

(71) Applicant: Konica Minolta, Inc., Tokyo (JP)

(72) Inventor: Kuniaki Shida, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 40 days.

(21) Appl. No.: 15/116,290

(22) PCT Filed: Feb. 13, 2015

(86) PCT No.: PCT/JP2015/053963
§ 371 (c)(1),
(2) Date: Aug. 3, 2016

(87) PCT Pub. No.: WO2015/125705
PCT Pub. Date: Aug. 27, 2015

(65) Prior Publication Data
US 2017/0009959 A1 Jan. 12, 2017

(30) Foreign Application Priority Data
Feb. 21, 2014 (JP) .................................. 2014-031534

(51) Int. Cl.
| | |
|---|---|
| G09F 13/04 | (2006.01) |
| G09F 13/08 | (2006.01) |
| F21V 11/00 | (2015.01) |
| G06F 1/16 | (2006.01) |
| F21V 3/04 | (2018.01) |
| F21V 5/02 | (2006.01) |
| G06F 3/044 | (2006.01) |

(52) U.S. Cl.
CPC .............. *F21V 11/00* (2013.01); *F21V 3/049* (2013.01); *F21V 5/02* (2013.01); *G06F 1/1637* (2013.01); *G06F 3/044* (2013.01)

(58) Field of Classification Search
CPC . F21V 11/00; F21V 3/044; F21V 5/02; G06F 1/1637; G06F 3/044; G02F 1/133606; G02B 5/0226; G02B 5/0294
USPC ........................................... 362/97.1
See application file for complete search history.

(56) References Cited

FOREIGN PATENT DOCUMENTS

| | | |
|---|---|---|
| JP | 2011192124 A | 9/2011 |
| JP | 2011209590 A | 10/2011 |

(Continued)

OTHER PUBLICATIONS

International Search Report dated Mar. 24, 2015 for PCT/JP2015/053963 and English translation.

(Continued)

*Primary Examiner* — Laura Gudorf
(74) *Attorney, Agent, or Firm* — Lucas & Mercanti, LLP

(57) ABSTRACT

The objective of the present invention is to provide a display device with excellent display quality, which has a light emitting pattern that is reduced in light blurring. A display device according to the present invention is sequentially provided at least with a transparent substrate, a first layer containing a light scattering body, a second layer that contains a light scattering body at a content ratio lower than that of the first layer, a light blocking layer having an opening pattern, and a light source that emits light in an area equal to or larger than the area of the opening pattern, in this order. This display device is characterized in that the content ratio of the light scattering body in the first layer is within the range of 30-90% by volume, and the thickness of the first layer is within the range of 3-15 μm.

10 Claims, 3 Drawing Sheets

(56) References Cited

FOREIGN PATENT DOCUMENTS

| | | |
|---|---|---|
| JP | 2014008687 A | 1/2014 |
| KR | 10-2008-0015540 A | 2/2008 |
| KR | 10-2012-0101416 A | 9/2012 |

OTHER PUBLICATIONS

IPRP dated Mar. 24, 2015 from the corresponding International Application; International Application No. PCT/JP2015/053963; Applicant: Konica Minolta, Inc.; English translation of IPRP; Total of 7 pages.
Office Action dated Feb. 6, 2018 from correspondirag Korean Patent Application No. 10-2016-7022378 and English translation.

DISPLAY DEVICE

CROSS REFERENCE TO RELATED APPLICATION

This Application is a 371 of PCT/JP2015/053963 filed on Feb. 13, 2015, which, in turn, claimed the priority of Japanese Patent Application No. JP2014-031534 filed on Feb. 21, 2014, both applications are incorporated herein by reference.

TECHNICAL FIELD

The present invention relates to a display device. More specifically, the present invention relates to a high-quality display device generating a light-emitting pattern with reduced blurring.

BACKGROUND ART

Many portable information devices have been used in recent years. Some of those portable information devices, such as smart phones, personal digital assistants (PDAs), and tablet devices, include touch panels as input means. The touch panel generally occupies almost all the front face of a device. The touch panel is made of a transparent substrate that transmits the light sent from a display device provided thereunder. Under the periphery of the touch panel surrounding the display device, a circuit board is disposed. It is not preferred that the circuit board is observable through the transparent touch panel. To prevent the circuit board from being observable, a light shield is provided on the periphery of the transparent substrate of the touch panel, which surrounds the display device.

For example, a frame punched from a thin metal plate or a light-shielding resin plate is bonded to the periphery of the transparent substrate to shield light. PTL 1 and PTL 2 disclose methods for applying black paint on the periphery of the transparent substrate by screen printing or pad printing.

Since the shading layer is observable on the surface of the information device, shading layers with various designs have been required recently.

For example, a touch panel of a cellular phone provides visual information on the status of the phone by turning on and off the light source or changing the colors of light when the user touches the panel. A touch panel of an air conditioning system in a vehicle is usually black and indistinguishable from a central console, and provides various kinds of literal information on temperature or air conditioning, for example, when the user touches the panel.

The touch panel includes a shading layer and a black shading layer provided thereunder having an aperture pattern corresponding to the shape of an indication to be displayed. The black shading layer is illuminated from the back and generates a light-emitting pattern corresponding to the shape of the aperture pattern. The upper shading layer has any color, for example, black, white, or blue depending on the product requirements.

A black shading layer has a sufficient shading effect even if the layer has a small thickness formed by printing, for example. Thus, the light-emitting pattern projected through the aperture pattern in the black shading layer has a clear outline and good visibility. A white shading layer generally develops its whiteness by light scattering. Thus, the white shading layer should be thick to have a sufficient shading effect and develop its bright whiteness. If a black shading layer having an aperture pattern is disposed under such a white shading layer to indicate various types of information, the light emitted from a back light source and projected through the aperture pattern generates a light-emitting pattern that is blurred outside the aperture pattern. The light may diffuses several or more times widely than the aperture pattern in a dark place, which significantly impairs display quality.

To solve this problem, PTL 3 discloses a thin white shading layer having a high shading effect. The white shading layer is formed by ink-jet printing and its surface has a predetermined arithmetic average roughness. However, this technique cannot sufficiently reduce the blurring of a light-emitting pattern.

CITATION LIST

Patent Literature

PTL 1: Japanese Patent Laid-Open No. 2011-192124
PTL 2: Japanese Patent Laid-Open No. 2011-209590
PTL 3: Japanese Patent Laid-Open No. 2014-008687

SUMMARY OF INVENTION

Problems to be Solved by Invention

The present invention has been made to solve the above problem and situation. An object of the invention is to provide a high-quality display device generating a light-emitting pattern with reduced blurring.

Means for Solving Problems

The inventor has investigated the causes of the above-described problem and has found that a reduced thickness of the nearest layer (a first layer) to an observer among white shading layers containing light scatterers and densely localizing the light scatterers in the first layer such that the first layer contains light scatterers in a higher content than that of the underlying white shading layer (a second layer) substantially contributes to a high shading effect and generation of a light-emitting pattern with reduced blurring projected through the aperture pattern.

The problems According to the present invention described above are solved as follows:

1. A display device including, in sequence: a transparent substrate; a first layer containing light scatterers; a second layer containing light scatterers in a lower content than that of the first layer; a shading layer having an aperture pattern; and a light source having a light-emitting area equal to or wider than the aperture pattern, wherein the first layer has a light scatterer content in the range of 30 to 90 vol % and a thickness in the range of 3 to 15 μm.

2. The display device according to item 1, wherein the second layer has a greater thickness than that of the first layer.

3. The display device according to item 1 or 2, wherein the first layer contains light scatterers having a volume average particle diameter in the range of 100 nm to 15 μm.

4. The display device according to any one of items 1 to 3, wherein the light scatterer content in the first layer is at least 1.2 times the light scatterer content in the second layer.

5. The display device according to any one of items 1 to 4, wherein a low-refractive-index layer having a lower refractive index than that of the transparent substrate is disposed between the transparent substrate and the first layer.

6. The display device according to item 5, wherein the low-refractive-index layer has a refractive index in the range of 1.0 to 1.5.

7. The display device according to item 5 or 6, wherein the low-refractive-index layer includes a resin layer.

8. The display device according to any one of items 5 to 7, wherein the low-refractive-index layer includes an air layer.

9. The display device according to any one of items 1 to 8, wherein the light source is provided with a prism sheet.

10. The display device according to any one of items 1 to 9, wherein the light source is provided with a louver layer.

Effects of Invention

The aspects of the present invention described above provide a high-quality display device generating a light-emitting pattern with reduced blurring. The display device also has a high shading effect, i.e., high invisibility of the aperture pattern. The mechanism of development and operation on the effects of the present invention is not clear, but can be presumed as follows.

Light scatterers are localized in the nearest layer (the first layer) to an observer to reduce light scattering (blurring) due to Mie scattering of scattering particles as much as possible, and the content of the light scatterers is reduced in the farther layer (the second layer) from the observer to improve the layer whiteness. The reduction in light scattering and the improvement in whiteness are thereby achieved independently. As a result, the display device has a high shading effect, i.e., high invisibility of the aperture pattern, and generates a light-emitting pattern with reduced blurring even if light is emitted from the back light source and projected through the aperture pattern.

EMBODIMENTS FOR CARRYING OUT THE INVENTION

Figure 1:
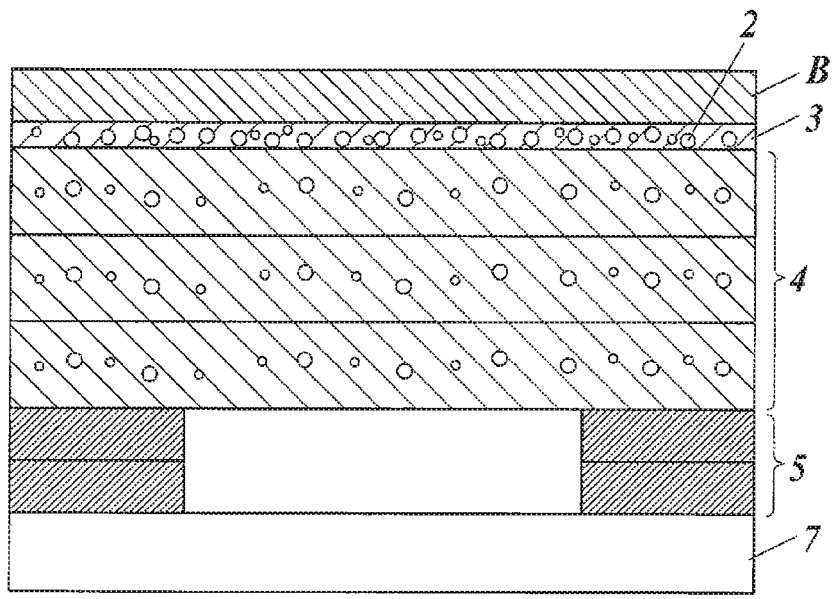
FIG. 1 illustrates a schematic cross-sectional view of a display device according to an embodiment of the present invention.

The display device of the present invention includes, in sequence, a transparent substrate, a first layer containing light scatterers, a second layer containing light scatterers in a lower content than that of the first layer, a shading layer having an aperture pattern, and a light source having a light-emitting area equal to or wider than the aperture pattern. The first layer has a light scatterer content in the range of 30 to 90 vol % and a thickness in the rage of 3 to 15 μm. These technical characteristics are common to the items 1 to 10 of the present invention.

In an embodiment of the present invention, the second layer should preferably be thicker than the first layer to enhance the effects of the present invention. The first layer should preferably contain light scatterers having a volume average particle diameter in the range of 100 nm to 15 μm. The light scatterers having such a size can achieve light scattering effects of an overall color region i.e., white color including blue and red colors. In addition, the volume average particle diameter is very close to the wave length of the incident light, hence, the scattered light has a narrow blurring width.

In an embodiment of the present invention, the light scatterer content in the first layer should preferably be at least 1.2 times the light scatterer content in the second layer. This configuration provides a light scattering site localized near the transparent substrate and leads to a reduction in the width and brightness of the blurring light due to light scattering in the second layer.

It is preferred to dispose a low-refractive-index layer having a lower refractive index than that of the transparent substrate between the transparent substrate and the first layer. The low-refractive-index layer should preferably have a refractive index in the range of 1.0 to 1.5 to reduce the interfacial reflection between the transparent substrate and the first layer for generating a brighter light-emitting pattern with reduced blurring. The low-refractive-index layer should preferably include a resin layer or an air layer particularly in the case of forming the low-refractive-index layer by printing.

In an embodiment of the present invention, since the scattering form is Mie scattering, light should preferably be scattered parallel to the incident direction. Since the light scattered in other directions causes light scattering or blurring outside the aperture pattern, the incident light is projected parallel to the aperture pattern as much as possible to reduce light scattering or blurring in the present invention. Thus, the light source should preferably be provided with a prism sheet. It is also preferred that the light source be provided with a louver layer, which causes similar effects to the prism sheet.

The structural elements, embodiments, and aspects of the present invention will now be described in detail. As used herein, the term to between two numerical values indicates that the numerical values before and after the term are inclusive as the lower limit value and the upper limit value, respectively.

The display device of the present invention will now be described in detail.

<Outline of Display Device>

The display device of the present invention includes, in sequence, a transparent substrate, a first layer containing light scatterers, a second layer containing light scatterers in a lower content than that of the first layer, a shading layer having an aperture pattern, and a light source having a light-emitting area equal to or wider than the aperture pattern. The first layer has a light scatterer content in the range of 30 to 90 vol % and a thickness in the rage of 3 to 15 μm.

Light scattering allows a viewer to observe reflected external white light in an unlighted state of the display device. Light scattering also causes light blurring outside the aperture pattern in a white shading layer. Based on the experimental results and numerical analyses for the present invention, the inventor has found that various physical phenomena occur due to Mie scattering, which depends on the particle size, the refractive index, and the particle density of light scatterers, and the refractive index and the thickness of a layer containing the light scatterers.

The inventor further has found that controlling the particle density of the light scatterers in the layer to localize the Mie scattering site in the vicinity of the site from which light is emitted to the outside (the air) reduces light diffusion or blurring due to Mie scattering to an unperceivable level for a person.

The physical phenomena due to Mie scattering have been already disclosed in many documents, such as "Hikari Sanran no Riron (Theory of Light Scattering)" written by Fumiaki Shibata ("Kotai Butsuri (Solid State Physics)" Vol. 20, 1985, published by ACNE).

The inventor found that a thinner first layer containing a larger number of light scatterers generates a light-emitting pattern with reduced blurring, which was projected through the aperture pattern, and make the layer look white while the display device is not activated. The second layer is formed to enhance the layer whiteness.

FIG. 1 illustrates a schematic cross-sectional view of a display device according to an embodiment the present invention.

The display device includes a first layer 3 containing light scatterers 2 and a second layer 4 containing light scatterers 2 in a lower content than that of the first layer 3. The first layer 3 is disposed under a transparent substrate B and the second layer 4 is disposed under the first layer 3. In FIG. 1, the second layer 4 consists of three sublayers to enhance the layer whiteness. A black shading layer 5 consisting of two sublayers and having an aperture pattern is disposed under the second layer 4. A light source 7 having a light-emitting area equal to or wider than the aperture pattern is disposed under the black shading layer 5. The light from the light source 7 passes through the aperture pattern in the black shading layer 5, the first white shading layer 3, and the second white shading layer 4 to be seen as a light-emitting pattern corresponding to the shape of the aperture pattern.

Figure 2:
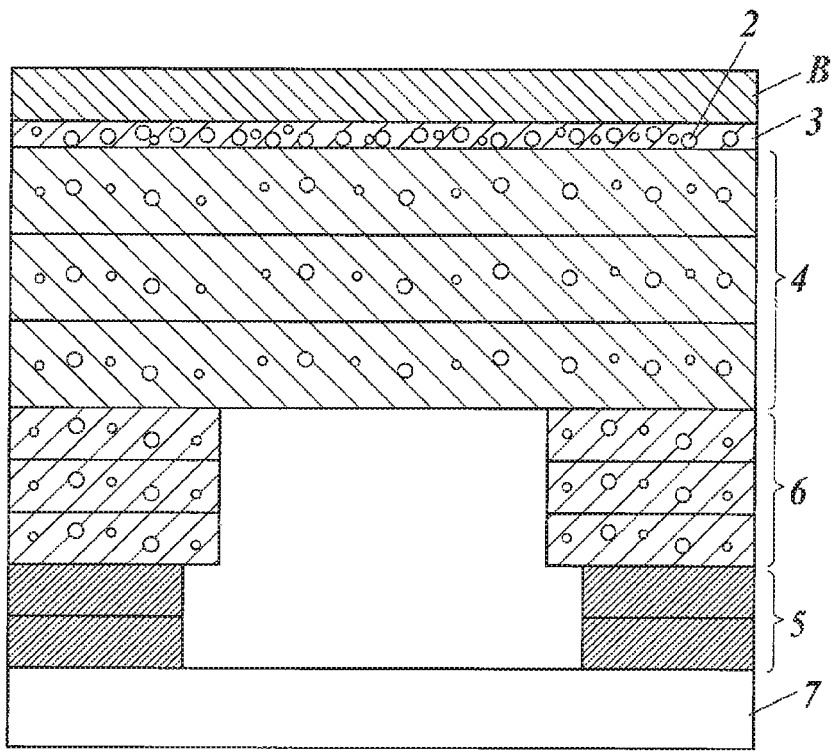
FIG. 2 illustrates a schematic cross-sectional view of a display device according to another embodiment of the present invention.

FIG. 2 illustrates a schematic cross-sectional view of a display device according to another embodiment of the present invention. In the embodiment shown in FIG. 2, the display device further includes a third layer 6 having an aperture pattern conforming to the shape of the aperture pattern in the shading layer having the aperture pattern. The third layer 6 is disposed under the second layer to enhance the layer whiteness. The third layer 6 also contains light scatterers to enhance the shading effects of the white shading layers even if the black shading layer having the aperture pattern is disposed thereunder. This makes the aperture pattern more invisible from the outside. In addition, since the black shading layer having the aperture pattern has a high shading effect, the black shading layer enhances the brightness (whiteness) of the white shading layers.

Figure 3:
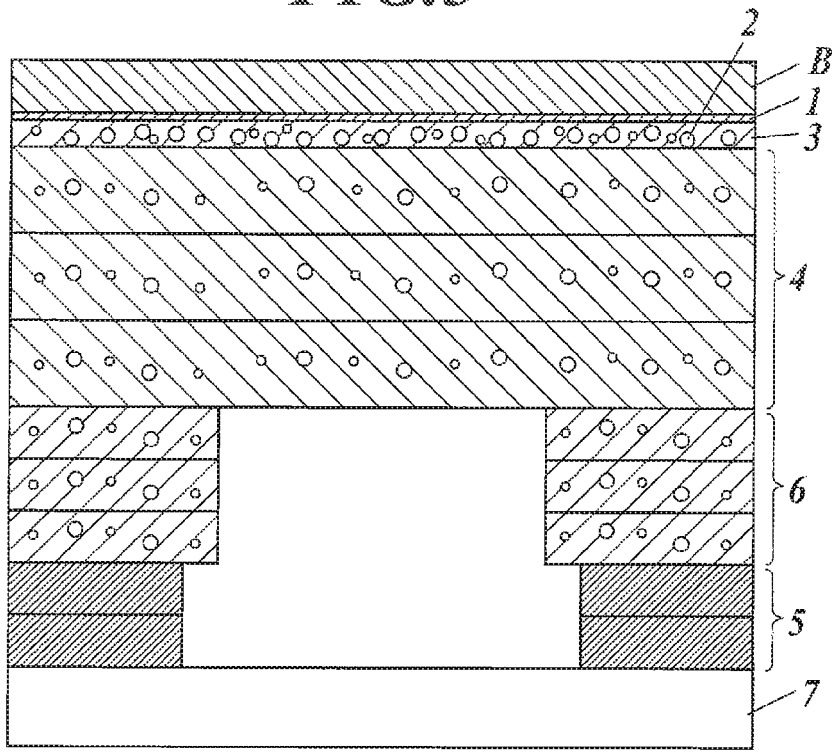
FIG. 3 illustrates a schematic cross-sectional view of a display device according to another embodiment of the present invention.

FIG. 3 illustrates a schematic cross-sectional view of a display device according to another embodiment of the present invention. In the embodiment shown in FIG. 3 in comparison with the embodiment shown in FIG. 2, the display device further includes a low-refractive-index layer 1 having a lower refractive index than that of the transparent substrate B. The low-refractive-index layer is disposed between the transparent substrate B and the first layer 3. This embodiment reduces the interfacial reflection between the transparent substrate B and the first layer and generates a brighter light-emitting pattern with reduced blurring.

<First Layer and Second Layer>

The display device of the present invention includes, in sequence, a transparent substrate, a first layer containing light scatterers, a second layer containing light scatterers in a lower content than that of the first layer, a shading layer having an aperture pattern, and a light source having a light-emitting area equal to or wider than the aperture pattern. The first layer has a light scatterer content in the range of 30 to 90 vol % and a thickness in the rage of 3 to 15 μm.

In the display device of the present invention, the first and second layers are shading layers containing light scatterers and utilizing light scattering for concealing an internal circuit in the information device such as a touch panel. The first and second layers also function to indicate a light-emitting pattern generated by light emitted from the back light source and projected through the aperture pattern.

In the first layer, light scatterers are localized to reduce light scattering (blurring) due to Mie scattering as much as possible. Thus, the first layer is a thin layer containing light scatterers in a high content. The second layer increase the brightness of the white shading layers while the display device is not activated.

This structure provides the display device that generates a light-emitting pattern with reduced blurring and looks bright white due to the first and second layers having sufficient shading effects while the device is not activated.

Although the mechanism of development and operation on the effects of the present invention is not clear, it is presumed that the reduction in light scattering and the improvement in whiteness achieved independently help to provide the display device generating a light-emitting pattern with reduced blurring even if the aperture pattern is illuminated from the back.

The first layer contains light scatterers in a content in the range of 30 and 90 vol % and the second layer contains light scatterers in a lower content than that of the first layer. The first layer should have a thickness in the range of 3 to 15 μm.

If the first layer contains light scatterers in a content lower than 30 vol %, the first layer will have a longer light scattering distance, which will preclude the reduction in light blurring. If the first layer contains light scatterers in a content higher than 90 vol %, the first layer will be disadvantageously brittle and weak. The first layer should preferably contain light scatterers in a content in the range of 30 to 80 vol %, more preferably 45 to 70 vol %.

It is preferred to localize light scatterers in the first layer in view of reduced light blurring. The light scatterer content in the first layer should preferably be at least 1.2 times the light scatterer content in the second layer.

If the first layer has a thickness smaller than 3 μm, it will be difficult to generate a clear white light-emitting pattern. If the first layer has a thickness greater than 15 μm, a light-emitting pattern will undesirably be blurred. The first layer should preferably have a thickness in the range of 5 to 10 μm, more preferably 5 to 8 μm.

The second layer contains light scatterers in a lower content than that of the first layer. The second layer functions to enhance the whiteness of the white shading layers. The second layer should preferably contain light scatterers in a content in the range of 5 to 50 vol %.

The second layer may be thicker than the first layer. This structure enhances the overall strength of the shading layers. The second layer should preferably have a thickness in the range of 10 to 100 μm, more preferably 25 to 75 μm.

It is preferred to dispose a third layer containing light scatterers and having an aperture pattern conforming to the shape of the aperture pattern in the shading layer (described below) under the second layer. This structure prevents a reduction in whiteness caused by the black shading layer having an aperture pattern disposed under the second layer while the display device is not activated. This structure also makes the shape of the aperture pattern, such as a character or a design, invisible from the outside while the display device is not activated, prevents a reduction in brightness of the light-emitting pattern, and substantially improve the display quality.

The shading effect of the white shading layer can be measured by its light transmittance. In an embodiment of the present invention, the white shading layer has a light transmittance in the range of 3 to 25%, preferably 5 to 15% in the aperture pattern, and has a light transmittance in the range of 0.1 to 20%, preferably 0.1 to 1% in the other area in the case of a light wave length of 550 nm. Such a light transmittance is determined by measuring the transmittance of diffused light. The transmittance of diffused light is measured with a spectrometer V-630 manufactured by JASCO Corporation, for example.

Each of the first, second, and third layers may consist of two or more sublayers having an identical structure.

The first, second, and third layers may contain any additive, such as a binder or dispersant, in addition to light scatterers as appropriate.

(Light Scatterers)

The light scatterers for the present invention may be of any type that can scatter light and have shading effects. The light scatterers should preferably develop whiteness. Examples of the light scatterers include calcium carbonate, barium sulfate, talc, mica, oxides such as titanium oxide, aluminum oxide, and silicon dioxide, metals, and intermetallic compounds. Examples of the light scatterers also include organic polymer particles or scattering particles containing those organic polymer particles. The light scatterers should preferably include a material having a high refractive index. Examples of the material having a high refractive index include, but not limited to, oxides such as titanium dioxide, zirconium oxide, bismuth oxide, cerium oxide, antimony oxide, and indium oxide. Most preferred among these materials is titanium dioxide, which has a high refractive index and can be readily available. These light scatterers can be produced by known methods.

The first layer should preferably contain light scatterers having a volume average particle diameter in the range of 100 nm to 15 μm, more preferably 200 nm to 1 μm, and most preferably 300 nm to 700 nm. The second layer may contain light scatterers having the same range of particle diameters.

The light scatterers may have a distribution of particle diameters to increase the content of the light scatterers in the layer. Light scatterers having a distribution of particle diameters may be used. Alternatively, a mixture of two or more types of light scatterers having different average particle diameters may be used. A mixture of different materials having optimal particle diameters may also be used.

The volume average particle diameter can be measured by, for example, light scattering, electrophoresis, or laser Doppler with a commercially available particle diameter measuring device. Specifically, the volume average particle diameter is measured by observing a curve indicating a particle diameter distribution and an integral curve of the distribution function, determining the particle point $D_{50}$ corresponding to 50% of the particle mass function in the integral curve as the volume average particle diameter.

Examples of the particle diameter measuring device include a laser-diffraction particle diameter measuring device SLAD1100 manufactured by Shimazu Corporation, a particle diameter measuring device LA-920 manufactured by HORIBA Ltd., and a Zetasizer 1000 manufactured by Malvern Instruments.

(Binder)

Preferably, the layers containing light scatterers should further contain a binder for stably holding the light scatterers, enhancing the strength of the layers, and improving the interlayer adhesion. The binder may be any known resin. Examples of the binder include olefinic polymers, acrylic resins such as oligoester acrylate, polyesters, polyamides, polyisocyanates, amino resins, xylene resins, ketone resins, diene resins, rosin modified phenolic resin, diene rubbers, chloroprene resins, polycarbonate resins, epoxy resins, silicone resins and waxes, and modified products and copolymers of these materials. The binder may be thermosetting resins or photocurable resins. Alternatively, the binder may be cured with a polymerization initiator added to a resin.

(Other Additives)

The shading layers containing light scatterers may be colored depending on the purposes. In this case, known coloring agents such as organic pigment and inorganic pigment may be used. Examples of the organic pigment include anthraquinone, anthrone, xanthene, diketopyrrolopyrrole, perylene, perinone, quinacridone, indigoid, and phthalocyanine.

A dispersion stabilizer may be used for enhancing the stability of the binder in the light scatterers. In the case of forming a layer in a wet process, additives such as a viscosity regulator and a defoaming agent may be used.

<Shading Layer Having Aperture Pattern>

The shading layer having an aperture pattern is disposed between the shading layer containing light scatterers and the light source. The shading layer having an aperture pattern displays various types of information on the shading layer by transmitting the light from the back through the aperture pattern.

Figure 4:
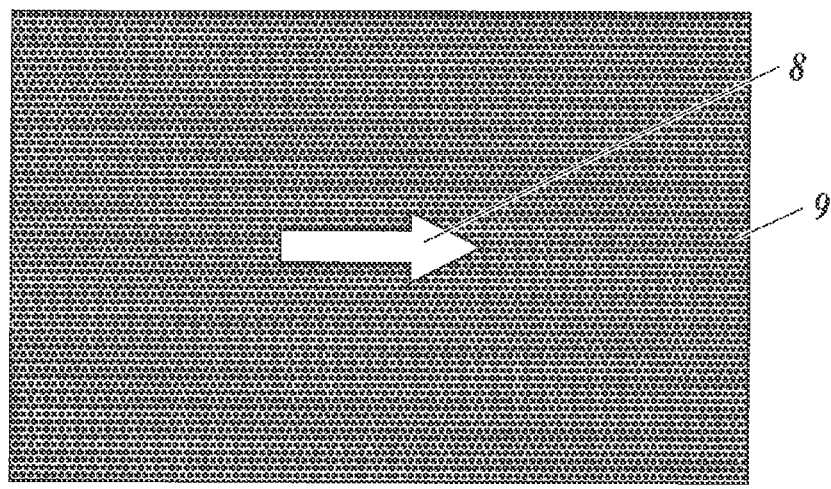
FIG. 4 is an example shading layer having an aperture pattern.

FIG. 4 illustrates an exemplary shading layer having an aperture pattern. The shading layer having an aperture pattern has an opening 8 corresponding to any indication to be displayed, and a shading area 9 having a high shading effect.

Examples of the aperture pattern herein include various designs (drawing patterns), characters, and images. For example, the aperture pattern is an ON/OFF switch, any other setting indication, or a logo mark.

The shading layer having an aperture pattern should preferably have a light transmittance of 1% or lower, more preferably 0.5% or lower, and most preferably 0.1% or lower in the area other than the aperture pattern. The shading layer having an aperture pattern may consist of two or more sublayers for lowering the light transmittance. The shading layer having an aperture pattern should preferably be thin for precluding light diffusion. The shading layer having an aperture pattern should preferably have a thickness in the range of 20 to 70 μm.

The shading layer having an aperture pattern may be composed of any material that has a low light transmittance and can form an aperture pattern. The shading layer having an aperture pattern can be made by punching an opaque member into an aperture pattern. The layer should preferably be formed with black ink in view of the small thickness of the layer. The ink may contain any known black pigment.

<Low-Refractive-Index Layer>

The display device of the present invention should preferably include a low-refractive-index layer between the transparent substrate and the first layer. The low-refractive-index layer has a lower refractive index than that of the transparent substrate. The refractive index should preferably be in the range of 1.00 to 1.5, more preferably 1.00 to 1.35.

Such a low-refractive-index layer reduces the interfacial reflection between the transparent substrate and the first layer. Since the low-refractive-index layer reduces diffusion of the light reflected on the transparent substrate in the first layer, the display device can efficiently guide the light from the light source to the outside without diminution of the light intensity to generate a brighter light-emitting pattern with reduced blurring.

The low-refractive-index layer may be composed of any material that can achieve the above combination of the refractive indices of the layers.

Since the transparent substrate should preferably be composed of resin or glass, the low-refractive-index layer is composed of any material having a lower refractive index than those of these materials. Since the first layer should preferably be composed of a resin containing light scatterers, the light scatterers should preferably have a high refractive index.

Specifically, the low-refractive-index layer should preferably be a resin layer. The resin layer should preferably be a low-refractive-index resin layer like the first layer without pigment. Alternatively, the low-refractive-index layer should preferably be an air layer. Since air has a refractive index of approximately 1.00, it has a larger effect.

In the present invention, the air layer is disposed between the transparent substrate and the first layer. The air layer may be formed behind the transparent substrate by any method chosen as appropriate. Examples of the method include lamination of hollow skeleton frames and formation of a porous ink layer containing air.

Examples of the resin for the low-refractive-index layer include polyester resins, acrylic resins, silicone resins, and epoxy resins.

The difference between the refractive index of the transparent substrate and that of the low-refractive-index layer should preferably be 0.2 or more, more preferably 0.3 or more.

The thickness of the low-refractive-index layer should preferably be determined based on the product of the refractive index and the layer thickness. The low-refractive-index layer having a refractive index in the range of 1 to 1.5 should preferably have a thickness in the range of 1 to 50 µm. The low-refractive-index layer having a smaller refractive index should preferably have a smaller thickness, preferably a thickness in the range of 1 to 38 µm. The low-refractive-index layer may consist of two or more sublayers.

The refractive index of the layer can be measured by known methods, for example, with a spectroscopic ellipsometer M-2000 manufactured by J. A. Woollam Japan.

<Formation of Layers>

The first, second, and third layers, the low-refractive-index layer, and the shading layer having an aperture pattern may be formed by any method. The methods for forming the layers include various known methods such as printing including spin coating, casting, and ink-jetting, and spray coating. The printing, ink-jetting, and spray coating are most preferred among these methods in view of ease of the formation of an aperture pattern.

The layers can be formed by printing with ink. The printing ink is prepared by mixing the above binder resin, light scatterers, and other additives in an appropriate solvent. Alternatively, the layers may be formed with a liquid polymer containing light scatterers. Alternatively, the layers may be formed by adding light scatterers to monomer, forming the layer of the mixture, and then curing the layer by polymerization.

Alternatively, the layers may be formed by spray coating in order that the layers have a high density of light scatterers. In this case, the layers may be formed by spray coating with a liquid containing light scatterers, a binder, and a solvent. Alternatively, the layers may be formed by spray coating with the liquid, spray coating with titanium oxide particles having a volume average particle diameter of approximately 500 nm thereon, and then spray coating with titanium oxide particles having a volume average particle diameter of approximately 100 nm thereon to fill the gaps between the particles.

It should be noted that spray coating can form a layer having a controlled local density of scattering particles and then separately apply pigment to the layer to reduce light scattering in the layer. As described below in the example for forming a display unit 3, the first layer having a high density of light scatterers can be formed by sequentially spraying ink, particles, and ink.

In this case, the layer contains a high density of particles. To enhance the adhesiveness of the ink layer to scattering particles and preclude peeling, the base ink layer may be first formed by spraying the ink containing a coupling agent in the range of 1 to 2 mass %, or spraying the ink containing a copolymer material of monomers having one or more functional groups including a hydroxy group, a carboxy group, an epoxy group, an amino group, an isocyanate group, and a silyl group to form a functional polymer layer that has an enhanced adhesiveness to inorganic metal scattering particles, or spraying the ink containing the copolymer material in a higher content. Applying scattering particles containing a coupling agent on the ink layer also enhances the adhesion between the ink layer and the scattering particle layer.

<Transparent Substrate>

The transparent substrate can be composed of any known glass material or resin film. Examples of the glass material include silica glass, soda lime silica glass, lead glass, borosilicate glass, and alkali-free glass. The glass material may be mechanically processed to be polished, for example, or an inorganic or organic layer, or a hybrid layer thereof may be formed on the surface of the glass material in view of the adhesiveness to the adjacent layer, durability, and smoothness if necessary.

Examples of the resin film include polyesters such as poly(ethylene terephthalate) (PET) and poly(ethylene naphthalate) (PEN); polyethylene; polypropylene; cellophane, cellulose esters such as cellulose diacetate, cellulose triacetate (TAC), cellulose acetate butyrate, cellulose acetate propionate (CAP), cellulose acetate phthalate, cellulose nitrate, and derivatives thereof; poly(vinylidene chloride); poly(vinyl alcohol); poly(ethylene-vinyl alcohol); syndiotactic polystyrene; polycarbonates; norbornene resins; polymethylpentene; polyetherketones; polyimides; polyethersulfones (PESs); poly(phenylene sulfide); polysulfones; polyetherimides; polyether ketone imides; polyamides; fluorinated resins; nylons; poly(methyl methacrylate), acrylates and polyarylates; and cycloolefin resins such as Arton (a product name, manufactured by JSR Corporation) and Apel (a product name, manufactured by Mitsui Chemicals, Inc.).

<Light Source>

Under (behind) the shading layer having an aperture pattern, a light source having a light-emitting area equal to or wider than the aperture pattern is disposed. The light source should preferably emit uniform light. The light source should preferably be an organic electroluminescent device (organic EL device) or a light-emitting diode (LED).

(Organic EL Device)

An organic EL device includes a cathode, a light-emitting layer, and an anode deposited on a substrate. The light-emitting layer is disposed between the cathode and the anode and contains a light-emitting compound (light-emitting material). Electrons and holes are injected into the light-emitting layer and recombined therein to generate excitons. The excitons then deactivated to emit light (fluorescence or phosphorescence). Preferred layer structures of the Organic EL device will be described below, but not limited to these examples.

(i) anode/light-emitting layer/electron transport layer/cathode
(ii) anode/hole transport layer/light-emitting layer/electron transport layer/cathode
(iii) anode/hole transport layer/light-emitting layer/hole-blocking layer/electron transport layer/cathode
(iv) anode/hole transport layer/light-emitting layer/hole-blocking layer/electron transport layer/cathode-buffering layer/cathode
(v) anode/anode-buffering layer/hole transport layer/light-emitting layer/hole-blocking layer/electron transport layer/cathode-buffering layer/cathode The hole transport layer herein includes a hole injection layer and an electron-blocking layer.

In the light-emitting layer, electrons and holes injected from the electrodes or the electron transport layer and the hole transport layer, respectively, are recombined to emit light. The light-emitting portion may be inside the light-emitting layer or at the interface between the light-emitting layer and the adjacent layer.

The structural elements of an organic EL device will now be described in detail.

[Substrate]

A preferred substrate applicable to an organic EL device is a transparent substrate composed of a transparent material, such as glass and plastic. Examples of the preferred transparent material include glass, quartz, and resin films. The resin film is most preferred among these materials.

Examples of the glass material include silica glass, soda lime silica glass, lead glass, borosilicate glass, and alkali-free glass. The glass material may be mechanically processed to be polished, for example, or an inorganic or organic layer, or a hybrid layer thereof may be formed on the surface of the glass material in view of the adhesiveness to the adjacent layer, durability, and smoothness if necessary.

Examples of the resin film include polyesters such as poly(ethylene terephthalate) (PET) and poly(ethylene naphthalate) (PEN); polyethylene; polypropylene; cellophane, cellulose esters such as cellulose diacetate, cellulose triacetate (TAC), cellulose acetate butyrate, cellulose acetate propionate (CAP), cellulose acetate phthalate, cellulose nitrate, and derivatives thereof; poly(vinylidene chloride); poly(vinyl alcohol); poly(ethylene-vinyl alcohol); syndiotactic polystyrene; polycarbonates; norbornene resins; polymethylpentene; polyetherketones; polyimides; polyethersulfones (PESs); poly(phenylene sulfide); polysulfones; polyetherimides; polyether ketone imides; polyamides; fluorinated resins; nylons; poly(methyl methacrylate), acrylates and polyarylates; and cycloolefin resins such as Arton (a product name, manufactured by JSR Corporation) and Apel (a product name, manufactured by Mitsui Chemicals, Inc.).

[Electrode]

The electrodes should preferably be transparent. The transparent electrodes may be composed of any metal material that can be used for forming an electrode for an organic EL device. Examples of the metal material include aluminum, silver, magnesium, lithium, magnesium/copper mixtures, magnesium/silver mixtures, magnesium/aluminum mixtures, magnesium/indium mixtures, indium, lithium/aluminum mixtures, rare earth metals, and oxide semiconductors such as indium tin oxide (ITO), ZnO, $TiO_2$, and $SnO_2$.

[Organic Functional Layer]

Functional layers, such as a charge injection layer, a light-emitting layer, a hole transport layer, an electron transport layer, and an electron-blocking layer, will now be described in this order.

(Charge Injection Layer)

In the present invention, a charge injection layer is disposed between an electrode and a light-emitting layer to lower a drive voltage and improve brightness. The charge injection layer is described in detail in Chapter II "Denkyoku Zairyo (Electrode Material)" (pp. 123 to 166) in "Yuki-EL-soshi to Sono Kogyoka Saizensen (Organic Electroluminescent Device and Frontline of Industrialization Thereof)" vol. 2 (Nov. 30, 1998, published by NTS Inc.). The charge injection layer includes a hole injection layer and an electron injection layer.

When the charge injection layer is a hole injection layer, the layer is disposed between an anode and a light-emitting layer or a hole transport layer. When the charge injection layer is an electron injection layer, the layer is disposed between a cathode and a light-emitting layer or an electron transport layer.

The hole injection layer of the present invention is disposed adjacent to the transparent anode to lower a drive voltage and improve brightness. The hole injection layer is described in detail in Chapter II "Denkyoku Zairyo (Electrode Material)" (pp. 123 to 166) in "Yuki-EL-soshi to Sono Kogyoka Saizensen (Organic Electroluminescent Device and Frontline of Industrialization Thereof)" vol. 2 (Nov. 30, 1998, published by NTS Inc.).

The hole injection layer is also disclosed in detail in Japanese Patent Laid-Open Nos. 9-45479, 9-260062, and 8-288069, for example. Examples of the material for the hole injection layer include derivatives of porphyrin, phthalocyanine, oxazole, oxadiazole, triazole, imidazole, pyrazoline, pyrazolone, phenylenediamine, hydrazon, stilbene, polyaryl alkane, triarylamine, carbazole, indolocarbazole, isoindole, acene such as anthracene and naphthalene, fluorene, and fluorenone, polyvinylcarbazole, polymer and oligomer materials in which aromatic amine is incorporated into main chains or side chains, polysilanes, conductive polymers and oligomers (e.g., polyethylenedioxythiophene (PEDOT): polystyrenesulfonic acid (PSS), aniline copolymers, polyaniline, and polythiophene).

Examples of the triarylamine derivative include benzidine types, such as α-NPD (4,4'-bis[N-(1-naphthyl)-N-phenylamino]biphenyl); starburst types, such as MTDATA (4,4', 4"-tris[N-(3-methylphenyl)-N-phenylamino]triphenylamine); and compounds having fluorene or anthracene in triarylamine connecting core portions.

In addition, hexaaza-triphenylene derivatives disclosed in Japanese Translation of PCT International Application Publication No. 2003-519432 and Japanese Patent Laid-Open No. 2006-135145 can be used for the materials for the hole transport layer.

The electron injection layer is disposed between a cathode and a light-emitting layer to lower a drive voltage and improve brightness. When the cathode is the transparent electrode of the present invention, the electron injection layer is disposed adjacent to the transparent electrode. The electron injection layer is described in detail in Chapter II "Denkyoku Zairyo (Electrode Material)" (pp. 123 to 166) in "Yuki-EL-soshi to Sono Kogyoka Saizensen (Organic Electroluminescent Device and Frontline of Industrialization Thereof)" vol. 2 (Nov. 30, 1998, published by NTS Inc.).

The electron injection layer is also disclosed in detail in Japanese Patent Laid-Open Nos. 6-325871, 9-17574, and 10-74586. A preferred material for the electron injection layer includes metals, such as strontium and aluminum; alkali metal compounds, such as lithium fluoride, sodium fluoride, and potassium fluoride; alkali metal halide layers, such as fluoro magnesium and calcium fluoride, alkaline earth metal compound layers, such as magnesium fluoride; metal oxides, such as molybdenum oxide and aluminum oxide; and metal complexes, such as lithium 8-hydroxyquinolate (Liq).

The electron injection layer should preferably be very thin. The layer thickness should preferably be in the range of 0.1 to 10 μm depending on the material used.

(Light-Emitting Layer)

The light-emitting layer constituting an organic functional layer of the organic EL device of the present invention should preferably contain a phosphorescent material or fluorescent material as a light-emitting material.

In the light-emitting layer, electrons injected from the electrode or the electron transport layer and holes injected from the hole transport layer are recombined to emit light. The light-emitting portion may be inside the light-emitting layer or at the interface between the light-emitting layer and the adjacent layer.

The light-emitting layer may have any structure as long as the contained light-emitting material satisfies the requirements for light emission. In addition, the light-emitting layer may consist of two or more sublayers having an identical emission spectrum or maximum wave length of emitted light. In this case, it is preferred that a non-light-emitting intermediate layer be disposed between the sublayers constituting the light-emitting layer.

The light-emitting layer should preferably have a total thickness in the range of 1 to 100 nm, more preferably 1 to 30 nm to reduce the drive voltage. The total thickness of the light-emitting layer includes the thickness(es) of the non-light-emitting intermediate layer(s) when the intermediate layer(s) is(are) disposed between the sublayers constituting the light-emitting layer.

The light-emitting layer should preferably be adjusted to have a thickness in the range of 1 to 50 nm, more preferably 1 to 20 nm.

The above light-emitting layer can be formed by known methods such as vacuum deposition, spin coating, casting, Langmuir Blodgett (LB) coating, or ink jetting with the light-emitting material and host compound described below.

The light-emitting layer may contain two or more mixed light-emitting materials, or a mixture of phosphorescent material and fluorescent material. The light-emitting layer should preferably contain a host compound and light-emitting material such that the light-emitting material emits light.

<Host Compound>

The host compound in the light-emitting layer should preferably have a phosphorescent quantum yield of less than 0.1, more preferably less than 0.01 at room temperature (25° C.). The light-emitting layer should preferably contain the host compound in the range of 50 wt % or more in the compounds.

The host compound may be composed of one or more known host compounds. A combination of two or more different host compounds can adjust the charge transfer and enhance the efficiency of an organic electric-field light-emitting device. Combined use of two or more light-emitting materials described below enables emission of light of any mixed color.

Examples of the host compound used for the light-emitting layer include known low molecular weight compounds, polymers having repetitive units, and low molecular weight compounds (vapor polymerizable host compounds) having a polymerizable group such as a vinyl group or an epoxy group.

Preferred known host compounds can transport holes or electrons, prevent emission of light from having long waves, and have a high glass transition point (Tg). The glass transition point (Tg) herein is measured by differential scanning colorimetry (DSC) in accordance with JIS-K-7121.

Examples of the host compound include chemical compounds disclosed in Japanese Patent Laid-Open Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837, US Patent Application Nos. 2003/0175553, 2006/0280965, 2005/0112407, 2009/0017330, 2009/0030202, and 2005/238919, WO2001/039234, WO2009/021126, WO2008/056746, WO2004/093207, WO2005/089025, WO2007/063796, WO2007/063754, WO2004/107822, WO2005/030900, WO2006/114966, WO2009/086028, WO2009/003898, WO2012/023947, Japanese Patent Laid-Open Nos. 2008-074939 and 2007-254297, and European Patent Laid-Open No. 2034538.

<Light-Emitting Material>

A phosphorescent or fluorescent material should preferably be used for the light-emitting material.

<Phosphorescent Material>

A phosphorescent material is a compound that emits light from a triplet excited state. In detail, the phosphorescent material emits phosphorescent light at room temperature (25° C.) and has a phosphorescent quantum yield of 0.01 or more at 25° C. The preferred phosphorescent quantum yield is 0.1 or more.

The phosphorescent quantum yield can be measured by the method described in Bunko II (Spectral Analysis II) page 398 of "Jikkenkagaku Koza VII (Experimental Chemistry Course VII)" vol. 4 (1992, published by Maruzen). The phosphorescent quantum yield can be measured with various types of catalysts in a solution. In the present invention, the phosphorescent material should have a phosphorescent quantum yield of 0.01 or more in any solvent.

Two fundamental mechanisms are known on light emission of a phosphorescent material: one mechanism is an energy transfer mechanism, in which carriers are transported to and recombined in the host compounds to excite the host compounds. The energy caused by the excitation of the host compounds is then transferred to the phosphorescent material to cause the phosphorescent material to emit light. Another mechanism is a carrier trap mechanism, in which the phosphorescent material functions as a carrier trap. The carriers are recombined in the phosphorescent material to cause the phosphorescent material to emit light. In both cases, the energy caused by the excitation of the phosphorescent material should be lower than the energy caused by the excitation of the host compounds.

Examples of the phosphorescent material include any known materials used for a light-emitting layer of a common organic EL device, preferably complex compounds containing metals belonging to Groups 8 to 10 in the periodic table of elements, more preferably iridium compounds, osmium compounds, platinum compounds (platinum complexes), and rare earth complexes. The iridium compounds are most preferred among these compounds.

At least one light-emitting layer may contain two or more phosphorescent materials and the light-emitting layer may have a variable proportion of the phosphorescent materials along the thickness.

Examples of the phosphorescent material include compounds described in the documents below.

The documents include Nature 395, 151(1998), Appl. Phys. Lett. 78, 1622 (2001), Adv. Mater. 19, 739 (2007), Chem. Mater. 17, 3532 (2005), Adv. Mater. 17, 1059 (2005), WO2009/100991, WO2008/101842, WO2003/040257, and US Patent Application Nos. 2006/835469, 2006/0202194, 2007/0087321, and 2005/0244673.

Examples of the phosphorescent material also include compounds described in Inorg. Chem. 40, 1704 (2001), Chem. Mater. 16, 2480 (2004), Adv. Mater. 16, 2003 (2004), Angew. Chem. Int. Ed. 2006, 45, 7800, Appln. Phys. Lett. 86, 153505 (2005), Chem. Lett. 34, 592 (2005), Chem. Commun. 2906 (2005), Inorg. Chem. 42, 1248 (2003), WO2009/050290, WO2002/015645, WO2009/000673, US Patent Application No. 2002/0034656, U.S. Pat. No. 7,332,232, US Patent Application Nos. 2009/0108737 and 2009/0039776, U.S. Pat. Nos. 6,921,915 and 6,687,266, US Patent Application Nos. 2007/0190359, 2006/0008670, 2009/0165846, and 2008/0015355, U.S. Pat. Nos. 7,250,226 and 7,396,598, US Patent Application Nos. 2006/0263635, 2003/0138657, and 2003/0152802, and U.S. Pat. No. 7,090,928.

Examples of the phosphorescent material also include compounds described in Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO2002/002714, WO2006/009024, WO2006/056418, WO2005/019373, WO2005/123873, WO2005/123873, WO2007/004380, WO2006/082742, US Patent Application Nos. 2006/0251923 and 2005/0260441, U.S. Pat. Nos. 7,393,599, 7,534,505, and 7,445,855, US Patent Application Nos. 2007/0190359 and 2008/0297033, U.S. Pat. No. 7,338,722, US Patent Application No. 2002/0134984, U.S. Pat. No. 7,279,704, and US Patent Application Nos. 2006/098120 and 2006/103874.

Examples of the phosphorescent material also include compounds disclosed in WO2005/076380, WO2010/032663, WO2008/140115, WO2007/052431, WO2011/134013, WO2011/157339, WO2010/086089, WO2009/113646, WO2012/020327, WO2011/051404, WO2011/004639, WO2011/073149, and Japanese Patent Laid-Open Nos. 2012-069737, 2009-114086, 2003-81988, 2002-302671, and 2002-363552.

Examples of the preferred phosphorescent material include organic metal complexes containing Ir central metals, more preferably complexes having at least one coordination of a metal-carbon bond, a metal-nitrogen bond, a metal-oxygen bond, and a metal-sulfur bond.

The above phosphorescent materials can be synthesized by the methods described in Organic Letter, vol. 3, No. 16, pp. 2579 to 2581 (2001), Inorganic Chemistry, vol. 30, No. 8, pp. 1685 to 1687 (1991), J. Am. Chem. Soc., vol. 123, p. 4304 (2001), Inorganic Chemistry, vol. 40, No. 7, pp. 1704 to 1711 (2001), Inorganic Chemistry, vol. 41, No. 12, pp. 3055 to 3066 (2002), New Journal of Chemistry, vol. 26, p. 1171 (2002), European Journal of Organic Chemistry, vol. 4, pp. 695 to 709 (2004), and references listed in these documents.

(Fluorescent Material)

Examples of the fluorescent material include coumarin dyes, pyran dyes, cyanine dyes, croconium dyes, squalium dyes, oxobenzanthracene dyes, fluorescein dyes, rhodamine dyes, pyrylium dyes, perylene dyes, stilbene dyes, polythiophene dyes, and rare earth complex fluorescent substances.

(Hole Transport Layer)

A hole transport layer is composed of a hole transport material that can transport holes. A hole injection layer and an electron-blocking layer can generally transport holes. One or more hole transport layers may be provided.

The hole transport material may be an organic or inorganic material that can inject or transport holes, or can block electrons. Examples of the hole transport material include derivatives of triazole, oxadiazole, imidazole, polyarylalkane, pyrazoline, pyrazolone, phenylenediamine, arylamine, amino-substituted chalcone, oxazole, styrylanthracene, fluorenone, hydrazon, stilbene, silazane, aniline copolymers, conductive polymer oligomers, and thiophene oligomers.

The hole transport materials may be these materials. Alternatively, the hole transport materials may be porphyrin compounds, aromatic tertiary amine compounds, and styrylamine compounds. The aromatic tertiary amine compounds are most preferred among those compounds.

Typical examples of the aromatic tertiary amine compounds and styrylamine compounds include N,N,N',N'-tetraphenyl-4,4'-diaminophenyl, N,N'-diphenyl-N,N'-bis(3-methylphenyl)-[1,1'-biphenyl]-4,4'-diamine (abbr.:TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4, 4'-diaminobiphenyl, N,N,N',N'-tetraphenyl-4,4'-diaminodiphenyl ether, 4,4'-bis(diphenylamino) quadriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostilbenezene and N-phenylcarbazole.

Examples of the aromatic tertiary amine compounds and styrylamine compounds also include compounds having two fused aromatic rings per molecule disclosed in U.S. Pat. No. 5,061,569, such as 4,4'-bis[N-(1-naphthyl)-N-phenylamino] biphenyl (abbr.: α-NPD), and compounds having three triphenylamine units connected in a starburst form disclosed in Japanese Patent Laid-Open No. 4-308688, such as 4,4',4"-tris[N-(3-methylphenyl)-N-phenylamino]triphenylamine (abbr.: MTDATA).

The polymers made by introducing these materials into the polymer chains or having these materials in the polymer main chains may be used. In addition, inorganic compounds such as p-type Si and p-type SiC may be used as hole injection or hole transport materials.

The p-type hole transport materials described in Japanese Patent Laid-Open No. 11-251067, J. Huang et. al., Applied Physics Letters, 80 (2002), p. 139 may also be used. In the present invention, use of these materials is preferred to provide a highly efficient light-emitting device.

The hole transport layer can be prepared by forming these hole transport materials into a thin layer by known methods, such as printing including vapor deposition, spin coating, casting, and ink-jetting, and Langmuir Blodgett (LB) coating. The hole transport layer may have any thickness, generally has a thickness in the range of 5 nm to 5 µm, preferably 5 to 200 nm. The hole transport layer may have a single-layer structure made of one or more of the above materials.

The hole transport layer may have higher p characteristics by being doped with an impurity. Examples of the methods for doping are described in Japanese Patent Laid-Open Nos. 4-297076, 2000-196140, and 2001-102175, and J. Appl. Phys., 95, 5773 (2004).

The enhanced p characteristics in the hole transport layer can provide an organic EL device that consumes less electricity.

(Electron Transport Layer)

An electron transport layer is composed of a material that can transport electrons, and generally includes an electron injection layer and a hole-blocking layer. The electron transport layer may have a single-layer or multi-layer structure.

In both cases, the electron transport layer should contain an electron transport material (a hole-blocking material) that constitutes a layer adjacent to the light-emitting layer and transports the electrons injected from the cathode to the light-emitting layer. Any known electron transport material can be used. Examples of the electron transport material include derivatives of nitro-substituted fluorene, diphenylquinone, and thiopyran dioxide, carbodiimide, fluorenylidenemethane derivatives, anthraquinodimethane, anthrone derivatives, and oxadiazole derivatives. Examples of the electron transport material also include thiadiazole derivatives which are produced by replacing an oxygen atom with a sulfur atom in an oxadiazole ring in the above oxadiazole derivatives, and quinoxaline derivatives which have a quinoxaline ring known as an electron attractive group. The electron transport material may also be a polymer containing one of these materials in its chain or a polymer having a main chain consisting of one of these materials.

Examples of the electron transport material also include metal complexes of 8-quinolinol derivatives, such as tris(8-quinolinol)aluminum (abbr.:$Alq_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (abbr.:Znq), and the metal complexes in which the central metal is replaced with In, Mg, Cu, Ca, Sn, Ga, or Pb.

Metal-free or metal phthalocyanines or the materials in which the terminus is replaced with an alkyl or sulfonate group in the metal-free or metal phthalocyanines can be preferably used for the electron transport material. Examples of the electron transport material also include distyrylpyrazine derivatives, which are also used in a light-emitting layer, and inorganic semiconductors such as n-type Si and n-type SiC, which are also used in a hole injection layer and a hole transport layer.

The electron transport layer can be formed by forming the above materials into a thin layer by known methods such as printing including vapor deposition, spin coating, casting, and ink-jetting, and Langmuir Blodgett (LB) coating. The electron transport layer may have any thickness, generally has a thickness in the range of 5 nm to 5 µm, preferably 5 to 200 nm. The electron transport layer may have a single-layer structure made of one or more of the above materials.

The electron transport layer may have higher n characteristics by being doped with an impurity. Examples of the methods for doping are described in Japanese Patent Laid-Open Nos. 4-297076, 10-270172, 2000-196140, and 2001-102175, and J. Appl. Phys., 95, 5773 (2004). The electron transport layer should preferably contain potassium or potassium compounds. A typical example of the potassium compound is potassium fluoride. The enhanced n characteristics in the electron transport layer can provide an organic EL device that consumes less electricity.

Examples of the electron transport materials (electron transport compounds) also include similar materials to the materials used for the above-described intermediate layer. The electron transport layer that functions as an electron injection layer may also include similar materials to the materials used for the above-described intermediate layer.

(Blocking-Layer)

The blocking layers includes a hole-blocking layer and an electron-blocking layer, and are provided in addition to the above-mentioned organic functional layers, if necessary. Examples of the hole-blocking layer are described in Japanese Patent Laid-Open Nos. 11-204258 and 11-204359, and "Yuki-EL-soshi to Sono Kogyoka Saizensen (Organic Electroluminescent Device and Frontline of Industrialization Thereof)" p. 237 (Nov. 30, 1998, published by NTS Inc.).

The hole-blocking layer also functions as an electron transport layer. The hole-blocking layer is composed of a hole-blocking material that transports electrons but transports few holes or blocks holes to improve the recombination rate of electrons and holes. An electron transport layer can also be used as a hole-blocking layer if necessary. The hole-blocking layer should preferably be disposed adjacent to the light-emitting layer.

The electron-blocking layer also functions as a hole transport layer. The electron-blocking layer is composed of a material that transports holes but transports few electrons or blocks electrons to improve the recombination rate of electrons and holes. A hole transport layer can be used as an electron-blocking layer if necessary. The hole-blocking layer of the present invention should preferably have a thickness in the range of 3 to 100 nm, more preferably 5 to 30 nm.

[Sealing Member]

A sealing member is disposed to cover a display area of an organic EL device. The sealing member may have a curved or flat profile. A flat profile is preferred because it facilitates the alignment of a sealing member during a lamination process. The sealing member should preferably be transparent. The transparent substrate described above may be used as the transparent sealing member.

Examples of the transparent sealing member include plates and films of glass, polymer, and metal. Examples of the glass plate material include soda lime glass, glass containing barium strontium, lead glass, aluminosilicate glass, borosilicate glass, barium borosilicate glass, and quartz. Examples of the polymer plate material include polycarbonates, acrylics, poly(ethylene terephthalate), polyether sulfide, and polysulfones. Examples of the metal plate material include one or more metals or alloys selected from the group consisting of stainless steel, iron, copper, aluminum, magnesium, nickel, zinc, chromium, titanium, molybdenum, silicone, germanium, and tantalum.

A polymer film is preferred for the transparent sealing member in view of thinning an organic EL device. The polymer film should preferably have a vapor permeation of $1\times10^{-3}$ g/m$^2$·24 h or less at 25±0.5° C. and 90±2% RH, which is measured in accordance with JIS K 7129-1992, more preferably an oxygen permeation of $1\times10^{-3}$ ml/m$^2$·24 h·atm or less (1 atm is equal to $1.01325\times10^5$ Pa), which is measured in accordance with JIS K 7126-1987, and a vapor transmittance of $1\times10^{-3}$ g/m$^2$·24 h or less at 25±0.5° C. and 90±2% RH.

Sandblasting or chemical etching is used for processing the transparent sealing member into a curved profile. Examples of the adhesive for the sealing member include photocurable or thermosetting adhesives having a reactivity vinyl group such as acrylic acid oligomers and methacrylic acid oligomers, and humidity-curable adhesives such as 2-cyanoacrylate. Examples of the adhesive also include thermosetting and chemo-curable epoxy adhesives (mixtures of two liquid components). Examples of the adhesive also include hot-melt polyamides, polyesters, and polyolefins. Examples of the adhesive also include cation-curable and ultraviolet-curable epoxy resin adhesives.

The adhesive should preferably adhere and cure at a temperature in the range of room temperature to 80° C. in order to avoid deterioration of the organic EL device during heat processing. The adhesive may contain a drying agent. The adhesive may be applied to a sealing member with a commercially available dispenser or by printing such as screen printing.

The gap between the sealing member and a display area of the organic EL device should preferably be filled with inert gas such as nitrogen or argon or inert liquid such as fluorohydrocarbon or silicon oil. Alternatively, the gap between the sealing member and the display area of the organic EL device may be a vacuum, or filed with a hygroscopic compound. Examples of the hygroscopic compound include metal oxides (such as sodium oxide, oxidation potassium, calcium oxide, barium oxide, magnesium oxide, and aluminum oxide), sulfate salts (such as sodium sulfate, calcium sulfate, magnesium sulfate, and cobalt sulfate), metal halides (such as calcium chloride, magnesium chloride, cesium fluoride, tantalum fluoride, cerium bromide, magnesium bromide, barium iodide, and magnesium iodide), and perchloric acid salts (such as barium perchlorate and magnesium perchlorate). Anhydrides of the sulfate salts, metal halides, and perchloric acid salts are also preferred.

(Light-Emitting Diode)

Another preferred light source is a light-emitting diode (LED). The LED may be of any type.

An LED chip or light-emitting device includes a light-emitting layer of a semiconductor, such as InN, AlN, GaN, InGaN, AlGaN, and InGaAlN, deposited on a substrate by metal-organic chemical vapor deposition (MOCVD). Examples of the structure of the semiconductor device include homostructures having an MIS junction, a PIN junction, or a PN junction, heterostructures, and double heterostructures. These structures can vary the wave lengths of the light emitted by the devices depending on the materials of the semiconductor layers and the composition of the mixed crystals. Examples of the structure also include a single quantum well structure and a multiple quantum well structure. In these structures, an active layer of the semiconductor device is deposited to be a thin layer having a quantum effect.

A gallium nitride semiconductor device should preferably include a substrate of sapphire, spinel, SiC, Si, ZnO, or GaN. A sapphire substrate is most preferred to deposit a layer of gallium nitride having a good crystallizability. In the case of a sapphire substrate, it is preferred that a buffer layer of GaN or AlN should be deposited on the substrate and then a gallium nitride semiconductor layer having a PN junction be deposited thereon. A GaN monocrystalline layer selectively deposited on a sapphire substrate through a SiO$_2$ mask is also used as a substrate. In this case, the light-emitting device and the sapphire substrate can be separated by removing SiO$_2$ by etching after the deposition of the semiconductor layers.

With a flip chip junction, the substrate should be transparent within the entire visible light region like a sapphire substrate.

A gallium nitride semiconductor already has a N-type conductivity before being doped with an impurity. In order to form an N-type gallium nitride semiconductor having an improved efficiency of light emission, for example, N-type dopants, such as Si, Ge, Se, Te, and C, are used as appropriate. In order to form a P-type gallium nitride semiconductor, P-type dopants, such as Zn, Mg, Be, Ca, Sr, and Ba, are used. The gallium nitride semiconductor, however, cannot have sufficient P characteristics only by being doped with a P-type dopant. The gallium nitride semiconductor thus should preferably be heated in a furnace or irradiated with low energy electron beams or plasma after being doped with a P-type dopant to have sufficient P characteristics.

A preferred layer structure of an LED chip should include a laminate of a sapphire or silicon carbide substrate provided with a buffer layer of gallium nitride or aluminum nitride deposited thereon at a low temperature, a N-type contact layer of a gallium nitride semiconductor, a N-type cladding layer of an aluminum gallium nitride semiconductor, an active layer of an indium gallium nitride semiconductor doped with Zn and Si, a P-type cladding layer of an aluminum gallium nitride semiconductor, and a P-type contact layer of a gallium nitride semiconductor.

In preparation of an LED chip having a sapphire substrate, the P-type and N-type semiconductor surfaces are exposed by etching, for example, and then a fluorescent layer having a desired shape is deposited on the semiconductor layers. A first electrode and a second electrode are then formed to be connected to the layers of respective conductivity types by spattering or vapor deposition. In preparation of an LED chip having a SiC substrate, a pair of electrodes may be formed on the semiconductor device utilizing the conductivity of the substrate.

The semiconductor wafer having the fluorescent layer is then completely cut into chips with a dicing saw having a rotating diamond-edged blade. Alternatively, the wafer is half-cut to have notches wider than the width of the cutting edges and then completely cut into chips by external force. Alternatively, the wafer is scribed with a scriber having a reciprocating diamond needle tip to have very thin scribe lines in a grid pattern, for example, and then completely cut into chips by external force. In these ways, the nitride semiconductor LED chips applicable to the present invention can be completed.

The light from the LED light source should preferably be diffused with a light-guiding plate so that the LED light source functions as a surface light source. The light-guiding plate may be of any known type.

The light may have different color patterns due to a modulating means for controlling the color of the light depending on the positions of the openings.

<<Condensation of Light>>

The light from the light source should preferably travel in the forward direction (the normal direction) of the light-emitting surface and not in oblique directions to prevent the light-emitting pattern from being blurred and improve the brightness. The light source should preferably include a layer or sheet that prevents light diffusion.

(Prism Sheet)

The light source should preferably be provided with a prism sheet.

Figure 5:
FIG. 5 illustrates a conceptual diagram of a light source provided with a prism sheet.

FIG. 5 illustrates a conceptual diagram of a light source provided with a prism sheet. A prism sheet 10 is provided on a light source 7. The prism sheet 10 has a prism on its surface and condenses upward light. The prism sheet 10 should preferably be disposed on the light source and right under the shading layer having an aperture pattern.

The prism sheet may have a similar shape to that of a prism film used in a liquid crystal display. The prism sheet may be a tetragonal or polygonal prism lens sheet, a semisphere lens sheet, or a lens sheet of a combination of these lens sheets. Two prism lens sheets each having a 45° prism angle in one axial direction may be laminated orthogonal to each other.

The prism elements of the prism sheet should preferably have a pitch in the range of 10 to 500 μm, preferably 20 to 200 μm, and has a height in the range of 3 to 500 μm, preferably 10 to 200 μm.

The prism sheet should preferably be composed of any transparent resin. Examples of such a resin include polycarbonates, acrylics, vinyl chloride, polymethacrylimide, and polyesters. The prism sheet should preferably be composed of a material having a higher refractive index than that of the transparent substrate.

Many of such films for condensing light are disclosed, for example, in Japanese Patent Laid-Open Nos. 07-174910 and 2009-069742.

(Louver Layer)

The light source should preferably be provided with a louver layer.

Figure 6:
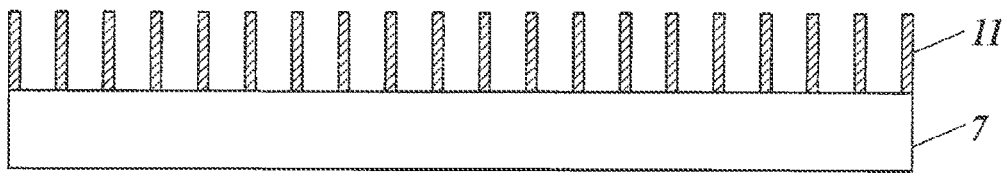
FIG. 6 illustrates a conceptual diagram of a light source provided with a louver layer.

FIG. 6 illustrates a conceptual diagram of a light source provided with a louver layer. A louver layer 11 is provided on a light source 7. The louver layer includes partitions to shield light traveling in oblique directions. The louver film having such a louver layer is used as a so-called anti-peep film. The louver film has a layer with partitions between which light passes through as disclosed in Japanese Patent Laid-Open No. 2007-052094. The structure thus prevents light diffusion in oblique directions from the light source.

The louver layer disposed on an organic EL light source only transmits the perpendicular light separated from the light emitted by the organic EL light source, which has Lambertian distribution characteristics, and shields the light traveling in oblique directions. As a result, light blurring due to light scattering is reduced.

The prism sheet and louver layer may be used together. In detail, the prism sheet is provided on the light source and the louver layer is provided thereon. This structure limits light scattering to the direction parallel to the incident light, thereby reducing light scattering outside the pattern. As a result, light blurring due to light scattering is reduced.

<<Application>>

The display device of the present invention should preferably be applied to portable information devices, such as smart phones, PDAs, and tablet devices. The display device should preferably be disposed in the periphery of a touch panel included in these information devices.

(Touch Panel)

A capacitive touch switch may be disposed in a layer above the light source of the present invention. The touch switch may be of a bipolar film type. The electrode of the touch switch should preferably be composed of an indium tin oxide (ITO) patterned by photo lithography, which has high light transmittance. Examples of the electrode include transparent oxide electrodes composed of indium oxide doped with zinc oxide (IZO), zinc oxide doped with aluminum (AZO), zinc oxide doped with boron (BZO), indium oxide doped with tungsten oxide and zinc oxide (IWZO), and tin oxide (SnOx), and transparent electrodes composed of Ag or Al or alloys thereof.

Besides the capacitive touch switch provided on the light source, a capacitive touch, resistive touch, or optical type provided with a flexible printed circuit (FPC) having a touch switching function may also be used. In addition, the switch may be disposed in the organic EL light source. The switch may be disposed above, below, or in the vicinity of the light source.

The organic EL light source in the display device of the present invention includes flat electrodes in the light-emitting device. The capacitive touch switch thus should preferably be disposed in a layer above the flat electrode and be of a bipolar film type patterned with ITO having high light transmittance.

In the case of use of a prism sheet, the touch switch may be disposed on or under the prism sheet. The laminate of the touch switch and prism sheets may have a sandwich structure: One of the prism sheets is disposed on the organic EL light source, the touch switch is disposed thereon, and another prism sheet is disposed thereon in an optically appropriate way designed to efficiently guide light and achieve a desirable color of light.

Examples of the present invention will now be described in detail. These examples should not be construed to limit the present invention. In the examples, "part" and "%" represent "mass part" and "mass %", respectively, unless otherwise noted.

In the examples below, the display device of the present invention consists of two components: a first component from the transparent substrate to the shading layer having an aperture pattern, and a second component or light source. The first component is called a display unit and the second component is called a light source unit. The light blurring of a light-emitting pattern was evaluated on the display device consisting of these two units.

Example 1

Preparation of Display Part 1

A first layer was formed on a transparent glass substrate having a thickness of 0.3 mm and a refractive index of 1.55. A binder of polyester resin (9007 ink manufactured by JUJO CHEMICAL CO., LTD.) and a thinner of Tetron manufactured by the company were used for the formation of the first layer. The first layer was formed by screen printing with a white ink containing a white pigment containing light scatterers of titanium oxide having a volume average particle diameter of 500 nm (PFC105, manufactured by ISHIHARA SANGYO KAISHA, LTD.). The resulting first layer contained titanium oxide of 45 vol % in the solid content and had a thickness of 10 μm after drying.

A white ink was prepared such that the amount of the light scatterers was 5 vol % in the solid content, and was applied three times by screen printing on the first layer into a second layer with a total thickness of 75 μm (each 25 μm) after drying.

The white shading layer consisting of the first and second layers had a transmittance of diffused light of 10% at 550 nm, which value was sufficient to transmit the light from the back light source.

The shading layer having an aperture pattern corresponding to a symbol having a width of 6 mm and a height of 2 mm as shown in FIG. 4, and the shading layer having a round opening with a diameter of 5 mm for evaluation of light blurring were formed by two screen printing operations with a black ink (IRX-HF screen ink, manufactured by Teikoku Printing Inks Mfg. Co., Ltd.) on the second layer. The resulting shading layer having an aperture pattern consisted of two sublayers each having a thickness of 25 μm and having a total thickness of 50 μm. The laminate of these layers constituted a display unit 1.

The display unit 1 corresponds to the display device shown in FIG. 1 from which the light source 7 is removed.

[Preparation of Display Unit 2]

A display unit 2 was prepared which had a higher whiteness in the white shading layer than the display unit 1 when the display device was not activated. In preparation of the display unit 2, an additional third layer was formed before the screen printing with black ink in the preparation of the display unit 1. After the screen printing of the first and second layers, the third layer was formed by three screen printing operations with the same ink as the one for the second layer in the area corresponding to the black shading layer having an aperture pattern, which shields the light from the light source, to improve the layer whiteness. The resulting third layer consisted of three sublayers each having a thickness of 25 μm and having a total thickness of 75 μm.

A shading layer having an aperture pattern was then formed by two screen printing operations on the third layer as in the preparation of the display unit 1. The resulting layer having an aperture pattern consisted of two sublayers having a total thickness of 50 μm. The display unit 2 was thereby completed. The display unit 2 corresponds to the display device shown in FIG. 2 from which the light source 7 is removed.

[Preparation of Display Unit 3]

In the preparation of the display unit 1 or 2, the ink was prepared by mixing light scatterers and other additives such as a binder. In preparation of a display device 3, a first layer was formed by spray coating such that the first layer contained light scatterers in a higher content than that in the display unit 1 or 2.

The white ink used for the second layer of the display unit 2 was spray coated with a spray coater on the transparent substrate. The ink used in the spray coating was prepared by diluting the ink used in the above example with a thinner (Z705, manufactured by Teikoku Printing Inks Mfg. Co., Ltd.). The spray coater was a MARK Vz manufactured by TOKYO OHKA KOGYO CO., LTD. The layer was formed under ordinal spray coating conditions on the other parameters.

A spray solution containing light scatterers of titanium oxide having a volume average particle diameter of 500 nm was prepared by diluting the above ink with the thinner and spray coated thereon. A spray solution containing titanium oxide having a volume average particle diameter of 100 nm was spray coated thereon to fill the gaps between the particles. The same ink as the one for the second layer of the display unit 2 was again spray coated thereon to fill the gaps between the particles.

The substrate with these layers was then pre-baked at 100° C. for 30 minutes, and post-baked at 150° C. for 30 minutes to evaporate the solvent in the spray solution and form a first layer. The resulting first layer contained light scatterers of 70 vol % and had a thickness of 6.4 μm. This layer contained light scatterers in the same content per unit area as that in the first layer of the display unit 1 or 2.

A second layer was then formed thereon by three screen printing operations as in the preparation of the display unit 2. The resulting second layer consisted of three sublayers each having a thickness of 25 μm.

A third layer was then formed thereon by three screen printing operations with the same ink as the one for the second layer in the area corresponding to the black shading layer having an aperture pattern, which shields the light from the light source, as in the preparation of the display unit 2, to improve the layer whiteness. The resulting third layer consisted of three sublayers each having a thickness of 25 μm and having a total thickness of 75 μm.

A shading layer having an aperture pattern was then formed thereon by screen printing operations as in the preparation of the display unit 1. The resulting shading layer having an aperture pattern consisted of two sublayers having a total thickness of 50 μm. The display unit 3 was thereby completed.

[Preparation of Display Unit 4]

In preparation of a display unit 4, a first layer was formed by spray coating as in the preparation of the display unit 3 such that the first layer contained light scatterers in a higher content.

The white ink used for the second layer of the display unit 2 was spray coated in a small amount with a spray coater on the transparent substrate. The ink used in the spray coating was prepared by diluting the ink used in the above example with a thinner (Z705, manufactured by Teikoku Printing Inks Mfg. Co., Ltd.). The spray coater was a MARK Vz manufactured by TOKYO OHKA KOGYO CO., LTD. The layer was formed under ordinal spray coating conditions on the other parameters.

A spray solution containing light scatterers of titanium oxide having a volume average particle diameter of 500 nm was prepared by diluting the above ink with the thinner and spray coated thereon. A spray solution containing titanium oxide having a volume average particle diameter of 100 nm was spray coated thereon to fill the gaps between the particles. The ink used for the second layer of the display unit 2 was again spray coated thereon in a small amount to fill the gaps between the particles.

The substrate with these layers was then pre-baked at 100° C. for 30 minutes, and post-baked at 150° C. for 30 minutes to evaporate the solvent in the spray solution and form a first layer. The resulting first layer contained light scatterers of 90 vol % and had a thickness of 3 μm.

A second layer, a third layer, and a shading layer having an aperture pattern were formed as in the preparation of the display unit 3. The display unit 4 was thereby completed.

[Preparation of Display Unit 5]

A display unit 5 was formed as in the preparation of the display unit 4 except that a first layer was formed by spray coating in a controlled amount such that the first layer contained light scatterers of 90 vol % and had a thickness of 2 μm.

[Preparation of Display Unit 6]

A display unit 6 was prepared as in the preparation of the display unit 1 except that a first layer was formed by screen printing with a controlled content of light scatterers such that the first layer contained titanium oxide of 30 vol % and had a thickness of 15 μm after drying.

[Preparation of Display Unit 7]

A display unit 7 was prepared as in the preparation of the display unit 1 except that a first layer was formed by screen printing with a controlled content of light scatterers such that the first layer contained titanium oxide of 30 vol % and had a thickness of 20 μm after drying.

[Preparation of Display Unit 8]

A display unit 8 was a comparative example. The display unit 8 includes a white shading layer containing unlocalized light scatterers. The white shading layer had a thickness of 85 μm, which was equal to the total thickness of the white shading layer constituted of the first and second layers of the display unit 1, and contained light scatterers in the same content per unit area as that in the first and second layers of the display unit 1. In detail, the white shading layer of the display unit 8 was formed by three screen printing operations with a white ink such that the layer contained light scatterers of 9.7 vol % in the solid content and had a thickness of 85 μm. The other layers of the display unit 8 were formed as in the preparation of the display unit 1.

[Preparation of Display Unit 9]

A display unit 9, another comparative example, was prepared as in the preparation of the display unit 8 except that the display unit 9 contained light scatterers in a content of 80%, which is lower than the content in the display unit 8.

The volume average particle diameter $D_{50}$ was measured with a laser-diffraction-type particle diameter measuring device SLAD1100 manufactured by Shimazu Corporation. The transmittance of diffused light at 550 nm was measured with a spectrometer V-630 manufactured by JASCO Corporation.

The contents (vol %) of light scatterers (titanium oxide) in the first to third layers and the layer thicknesses are shown in Table 1.

TABLE 1

| Display unit | First layer | | Second layer | | Third layer | |
|---|---|---|---|---|---|---|
| | Content of light scatterers (Vol %) | Thickness (μm) | Content of light scatterers (Vol %) | Thickness (μm) | Content of light scatterers (Vol %) | Thickness (μm) |
| 1 | 45 | 10 | 5 | 75 | — | — |
| 2 | 45 | 10 | 5 | 75 | 5 | 75 |
| 3 | 70 | 6.4 | 5 | 75 | 5 | 75 |
| 4 | 90 | 3 | 5 | 75 | 5 | 75 |
| 5 | 90 | 2 | 5 | 75 | 5 | 75 |
| 6 | 30 | 15 | 5 | 75 | — | — |
| 7 | 30 | 20 | 5 | 75 | — | — |
| 8 | Content 9.7 (Vol %), thickness 85 μm | | | | — | — |
| 9 | Content 7.8 (Vol %), thickness 85 μm | | | | — | — |

[Preparation of Light Source Unit 1]

In this example, a surface-emitting organic EL device was used.

In this example, an organic EL device that emitted white light was used. The organic EL light source was prepared as follows.

(Preparation of Organic EL Device)

<<Preparation of Organic EL Device 1>>

A glass substrate of 100 mm×100 mm×1.1 mm provided with an anode of an indium tin oxide (ITO) layer of 100 nm (NA45, manufactured by NH Techno Glass) was prepared and patterned. The transparent substrate provided with the ITO transparent electrode then underwent ultrasonic cleaning with isopropyl alcohol, drying with nitrogen gas, and UV ozone cleaning for 5 minutes.

On the transparent substrate, a diluted solution of 70% poly(3,4-ethylenedioxythiophene)-polystyrenesulfonate (PEDOT/PSS, CLEVIO P VP AI 4083, manufactured by H. C. Starck GmbH) in pure water was applied by spin coating at 3000 rpm for 30 seconds and dried at 200° C. for one hour to form a first hole transport layer with a thickness of 20 nm.

The transparent substrate was then attached to a substrate holder in a commercially available vapor deposition system. The vapor deposition system was then loaded with α-NPD of 100 mg, a host compound of CBP of 100 mg, green, blue, and red light-emitting materials of Ir(ppy)$_3$, D-10, D-26, respectively, of 100 mg, HB-1 of 100 mg, and Alg$_3$ on different molybdenum resistance heating boards.

After a reduction in pressure in the vacuum chamber to $4\times10^{-4}$ Pa, the heating board containing α-NPD was energized to deposit the α-NPD on the transparent substrate at a deposition rate of 0.1 nm/sec and form a second hole transport layer with a thickness of 20 nm.

The heating board containing the host compound of CBP, and the heating board containing the green, blue, and red light-emitting materials were then energized to simultaneously deposit the CBP and the light-emitting materials on the hole transport layer at a deposition rate of 0.1 nm/sec and at a deposition rate of 0.006 nm/sec, respectively, and form a light-emitting layer with a thickness of 40 nm.

The heating board containing HB-1 was then energized to deposit the HB-1 on the light-emitting layer at a deposition rate of 0.1 nm/sec and form a hole-blocking layer with a thickness of 5 nm.

The heating board containing Alg$_a$ was then energized to deposit the Alg$_a$ on the hole-blocking layer at a deposition rate of 0.1 nm/sec and form an electron transport layer with a thickness of 30 nm. The temperature of the substrate was the same as room temperature during the deposition processes.

Cesium fluoride (CsF) was then deposited thereon to form an electron injection layer with a thickness of 0.5 nm and aluminum was deposited thereon to form a cathode with a thickness of 110 nm. The organic EL device 1 was thereby completed.

The non-luminous side of the organic EL device was covered with a glass cover. A photocurable epoxy adhesive (Luxtrack LC0629B, manufactured by TOAGOSEI CO., LTD.) or sealing material was applied to the periphery of the glass cover, which was to be in contact with the glass board of the organic EL device. The glass cover was disposed to tightly contact the transparent substrate on the cathode side. The adhesive was irradiated with UV light from the glass substrate side to be cured. The sealed organic EL device was used as the organic EL light source.

The structures of the compounds used for forming the above organic EL device 1 are shown as follows:

[Compound 1]

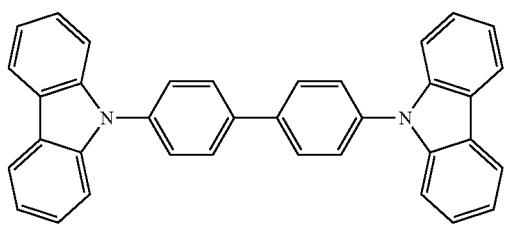

CBP

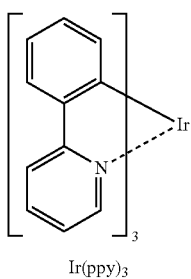

Ir(ppy)₃

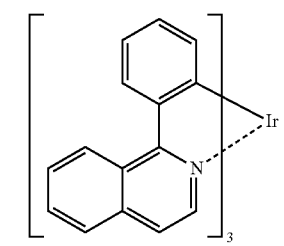

D-10

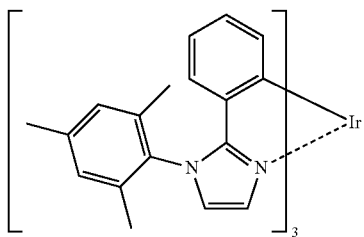

D-26

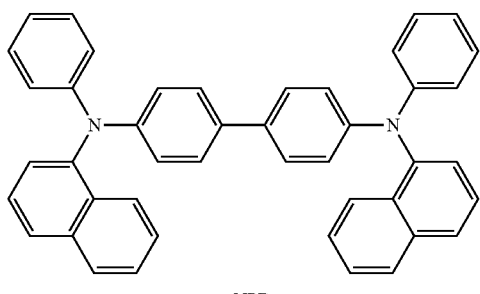

α-NPD

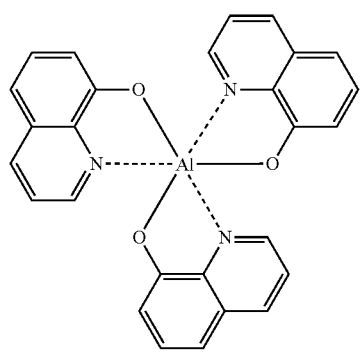

Alq₃

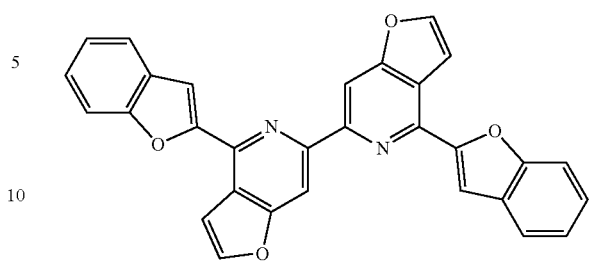

HB-1

In preparation of a light source unit 1, prism sheets were disposed on the organic EL light source to condense light in a direction toward the deposited layers.

In detail, one of the prism sheets was disposed on the organic EL device 1 in the X-axis and the other prism sheet was disposed thereon in the Y-axis orthogonal to the X-axis to condense light. The prism sheets were composed of polycarbonate and included prism elements having a pitch of 10 μm and a cone angle of 45° (BEF 4, manufactured by 3M).

[Preparation of Light Source Unit 2]

A light source unit 2 included a surface-emitting organic EL device as of the light source unit 1. In this example, the light source unit 2 included a louver layer on the organic EL device. The louver layer condensed light in a different way from the condenser on the organic EL device in the light source unit 1. The louver layer shielded oblique light.

(Preparation of Louver Layer)

The louver layer was prepared in accordance with the method disclosed in Japanese Patent Laid-Open No. 2007-52094. A first sheet of transparent silicone rubber (Product Name: KE153U, manufactured by Shin-Etsu Chemical Co., Ltd.) having a thickness of 200 μm was used as a light transmission band.

A second sheet having a thickness of 20 μm was used as a light-shielding band. The second sheet was composed of a material containing transparent silicone rubber (Product Name: KE153U, manufactured by Shin-Etsu Chemical Co., Ltd.) in 100 mass part and carbon black in 15 mass part.

The first sheets and the second sheets were laminated alternately two or more times. The laminate of the sheets was heated, vulcanized, and pressurized to form a single block.

The block was sliced perpendicular to the surfaces of the sheets to form a louver layer 1 with a thickness of 360 μm.

The louver layer 1 was disposed on an organic EL device 1 of the same type as that used in the light source unit 1 to complete a light source unit 2.

[Preparation of Light Source Unit 3]

In this example, a surface-emitting organic EL device 1 of the same type as that used in the light source unit 1 or 2 was used. Two prism sheets of the same type as that used in the light source unit 1 were disposed on the organic EL device 1 and a louver layer of the same type as that used in the light source unit 2 was disposed thereon to condense the front light. The light source unit 3 generated a brighter light-emitting pattern than the light source unit 2.

[Preparation of Light Source Unit 4]

An LED provided with a light-guiding plate was applied to a light source. In detail, a white LED with a light-guiding plate was used to achieve surface emission.

(Preparation of LED Light Source)

An LED chip composed of an $In_{0.2}Ga_{0.8}N$ semiconductor having a main emission peak at 460 nm was prepared. The gallium nitride semiconductor layer for the LED chip was formed on a cleaned sapphire substrate by MOCVD with trimethylgallium (TMG) gas, trimethylindium (TMI) gas, nitrogen gas, a dopant gas, and a carrier gas.

The PN junction of an gallium nitride semiconductor of N-type conductivity and a gallium nitride semiconductor of P-type conductivity was made by switching a dopant gas from monosilane ($SiH_4$) gas to cyclopentadienyl magnesium ($Cp_2Mg$) gas. The light-emitting semiconductor device includes a contact layer of a gallium nitride semiconductor of N-type conductivity, a cladding layer of a gallium aluminum nitride semiconductor of P-type conductivity, and a contact layer of a gallium nitride semiconductor of P-type conductivity. A non-doped InGaN active layer having a thickness of approximately 3 nm and a single quantum well structure was formed between the contact layer of N-type conductivity and the cladding layer of P-type conductivity. A buffer layer of a gallium nitride semiconductor was formed on the sapphire substrate at a low temperature. The semiconductors of P-type conductivity were annealed at 400° C. or higher after the layer formation.

The surfaces of the P and N semiconductors on the sapphire substrate were exposed by etching. Each of the completed LED chips included a plurality of exposed surface areas in the P and N semiconductors. The semiconductor layers were partially removed until the sapphire substrate and electrically separated from each other such that the semiconductor wafer was cut into rectangular LED chips. In the wafer, a resist was previously applied to the pad electrode surface on which a conductive gold wire was to be disposed.

As disclosed in an example in Japanese Patent Laid-Open No. 2004-95765, ethyl silicate containing $SiO_2$ of 10 mass %, a solvent, water, and a 1N hydrochloric acid (HCl) were mixed to hydrolyze the ethyl silicate. The resulting sol solution had a viscosity in the range of 2.5 to 500 mPa·s at 25° C.

A mixed solution containing the hydrolyzed ethyl silicate solution, ethylene glycol, and light scatterers in a mass ratio of 1 to 1 to 1 was then prepared and agitated. The resulting coating solution contained homogeneously distributed light scatterers having an average particle diameter in the range of 0.4 to 10 µm.

The coating solution was repeatedly applied to the upper surface of the light-emitting device until the layer had a thickness of 2 µm.

While the light-emitting device was left at room temperature for a certain time, the hydrolyzed ethyl silicate solution was gradually modified from the sol state to a gel state due to spontaneous drying.

In order to prepare amorphous $SiO_2$ from the gel solution and to evaporate ethanol generated during the hydrolysis of ethyl silicate and the solvent, the light-emitting device was heated at 150° C. for 30 minutes. The light-emitting device was then dried at 300° C. for two hours to yield $SiO_2$.

The wafer was diced with a dicer along etching lines for division into LED chips and scribed with a scriber to have scribe lines. The wafer was pressurized with a roller on the side of the sapphire substrate and divided into individual LED chips along the scribe lines.

A packages for the LED chip was prepared by insert molding with a polycarbonate resin. The package for the LED chip had an opening for receiving the LED chip. The package also included an external electrode of a copper piece plated with silver. The LED chip was fastened in the package with epoxy resin. The white LED was thereby completed.

Figure 7:
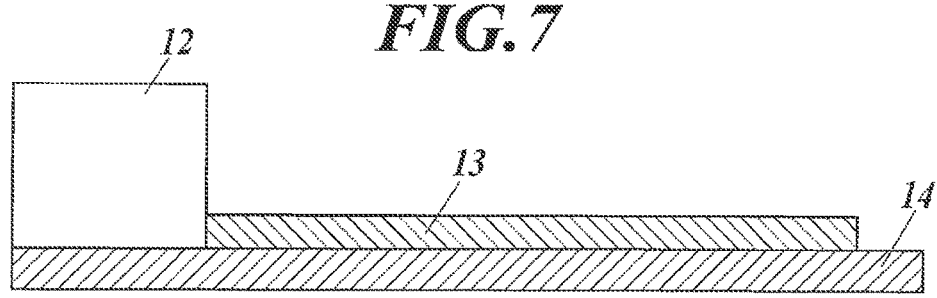
FIG. 7 illustrates a conceptual diagram of an LED light source provided with a light-guiding plate.

The LED chip was used as a light source as shown in FIG. 7. FIG. 7 illustrates a conceptual diagram of an LED light source provided with a light-guiding plate. An LED light source 12 achieves upward surface emission of white light through the light-guiding plate 13 with a diffuser. The LED light source 12 was used as a light source unit 4.

<<Preparation of Display Device>>

Display devices 1 to 18 were prepared by combining the light source units 1 to 4 and the display units 1 to 9 as shown in Table 2. Each of the light source units was combined with a corresponding display unit by bonding the light-emitting surface of the light source unit to the shading layer having an aperture pattern in the display unit. The light-emitting area of each light source unit was at least 500 µm wider than the aperture pattern.

[Evaluation]

The display devices were evaluated for the light blurring in a lighted state, the appearance in an unlighted state, and the display brightness in a lighted state.

(Light Blurring in Lighted State)

The brightness measured through the aperture pattern in a lighted state was set at 100 cd/m$^2$. Under this condition, the width of the blurring light due to light scattering was measured for comparison.

Figure 8:
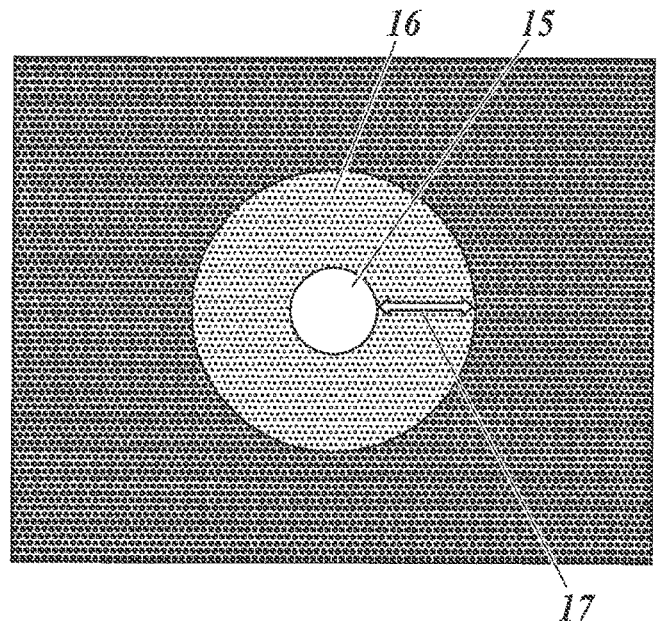
FIG. 8 illustrates a schematic diagram of a shading layer having an aperture pattern used for measurement.

FIG. 8 illustrates a schematic diagram of a shading layer having an aperture pattern used for the measurement of the blurring light. The aperture pattern was a circular opening with a diameter of 5 mm. When the light source was activated, halo 16 appeared around an aperture pattern 15. The width 17 of halo or blurring light was measured to evaluate the degree of blurring.

At the beginning, the brightness of the light projected through the aperture pattern in a lighted state was set at 100 cd/m$^2$ and the width of the blurring light having a brightness of 0.5 cd/m$^2$ or higher from the edge of the aperture pattern was measured with a two-dimensional color luminance meter CA-2000 manufactured by Konica Minolta, Inc. This width was determined as a measure of light blurring. A smaller value is preferred because it represents reduced light blurring. The width of the blurring light having a brightness of 0.5 cd/m$^2$ or higher had a correlation with the degree of light blurring evaluated by sensory evaluation with various aperture patterns, one of which is shown in FIG. 4.

(Brightness in Lighted State)

The brightness of each display device in a lighted state was measured and evaluated with a relative value to the brightness "100" of the display device 17. The brightness was measured by a two-dimensional color luminance meter CA-2000 manufactured by Konica Minolta, Inc.

(Appearance in Unlighted State)

The display device of the present invention has an advantage in that the aperture pattern is barely observable in an unlighted state. In addition, the display device exhibits reduced light blurring due to light scattering. Accordingly, the invisibility of the aperture pattern in an unlighted state was evaluated by sensory evaluation in the direction of the normal line and in an oblique direction (at a viewing angle of approximately 60°) under ambient light having a brightness of approximately 500 lx. The criteria for the evaluation are as follows.

Circle (○): the aperture pattern is invisible both in the direction of the normal line and the oblique direction.

X: the aperture pattern is visible at least in one of the direction of the normal line and the oblique direction.

The results of comprehensive evaluation in consideration of the invisibility of the aperture pattern in an unlighted state and the degree of light blurring in a lighted state are ranked with A, B, and C as follows.

The blurring widths in the ranks are as follows.

A: the aperture pattern is invisible, and the blurring width is less than 2 mm.

B: the aperture pattern is invisible, and the blurring width is 2 mm or more and less than 4 mm.

C: the aperture pattern is invisible, and the blurring width is 4 mm or more.

X: the aperture pattern is visible.

(PFC105, manufactured by ISHIHARA SANGYO KAISHA, LTD.) as described above such that the first layer contained titanium oxide of 45 vol % in the solid content and had a thickness of 10 μm after drying.

A second layer was formed by three screen printing operations with a white ink as in the preparation of the first layer such that the second layer contained light scatterers of 5 vol % in the solid content and consisted of three sublayers each having a thickness of 25 μm and having a total thickness of 75 μm after drying.

A third layer and a shading layer having an aperture pattern were formed thereon as in the preparation of the display unit 2. The display unit 21 having a low-refractive-index layer was thereby completed.

TABLE 2

| | | Display device | | | | Results of evaluation | | | |
|---|---|---|---|---|---|---|---|---|---|
| | | Display unit | | Light source unit | | Brightness in lighted state (Relative) | Appearance in unlighted state | Light blurring in lighted state (nm) | |
| No. | No. | Method for forming first layer | Third layer | Light No. | condenser | | | | Evaluation Note |
| 1 | 1 | Screen printing | Not formed | 1 | Prism sneet | 115 | ○ | 1.5 | A Inventive |
| 2 | 2 | Screen printing | Formed | | | 112 | ○ | 2.0 | B Inventive |
| 3 | 3 | Spray coating | Formed | | | 122 | ○ | 2.5 | B inventive |
| 4 | 1 | Screen printing | Not formed | 2 | Louver layer | 113 | ○ | 1.0 | A Inventive |
| 5 | 2 | Screen printing | Formed | | | 111 | ○ | 1.5 | A Inventive |
| 6 | 3 | Spray coating | Formed | | | 119 | ○ | 2.0 | B Inventive |
| 7 | 1 | Screen printing | Not formed | 3 | Prism sheet + | 116 | ○ | 1.4 | A Inventive |
| 8 | 2 | Screen printing | Formed | | Louver layer | 115 | ○ | 1.5 | A Inventive |
| 9 | 3 | Spray costing | Formed | | | 120 | ○ | 2.0 | B Inventive |
| 10 | 1 | Screen printing | Not formed | 4 | None | 107 | ○ | 2.0 | B Inventive |
| 11 | 2 | Screen printing | Formed | | | 112 | ○ | 3.0 | B Inventive |
| 12 | 3 | Spray coating | Formed | | | 115 | ○ | 3.5 | B Inventive |
| 13 | 4 | Spray coating | Formed | | | 130 | ○ | 3.5 | B Inventive |
| 14 | 5 | Spray costing | Formed | | | 200 | X | 3.0 | C Comparative |
| 15 | 6 | Screen printing | Not formed | | | 105 | ○ | 3.8 | B Inventive |
| 16 | 7 | Screen printing | Not formed | | | 80 | ○ | 4.5 | C Comparative |
| 17 | 8 | Screen printing | Not formed | | | 100 | ○ | 8.0 | C Comparative |
| 18 | 9 | Screen printing | Not formed | | | 145 | X | 2.0 | X Comparative |

As shown in Table 2, the display devices 1 to 13 and 15 of the present invention have reduced light blurring and satisfactory appearance in an unlighted state compared to the comparative display devices 14, and 16 to 18. The display devices 1 to 9 including a light condenser on the light source have higher brightness and reduced light blurring.

Example 2

Preparation of Display Unit 21

A display unit 21 was prepared as in the preparation of the display unit 2 except that a low-refractive-index layer contained only a binder but not a pigment.

In the preparation of the display unit 2, a low-refractive-index layer was formed on a transparent glass substrate having a thickness of 0.3 mm and a refractive index of 1.55 by screen printing with a fluororesin ink containing fluoroethylene vinyl ether having a refractive index of 1.38 (manufactured by Creative Products). The resulting low-refractive-index layer had a thickness of 28 μm after drying. The substrate with the layer was then heated at 130° C. for 30 minutes to cure the ink.

A first layer was formed thereon by screen printing with a white ink containing the fluororesin ink as a solvent and a white pigment containing light scatterers of titanium oxide having a volume average particle diameter of 500 nm

[Preparation of Display Unit 22]

A display unit 22 was prepared as in the preparation of the display unit 2 except that the display unit 22 included an air layer.

A low-refractive-index layer was formed on a transparent glass substrate having a thickness of 0.3 mm and a refractive index of 1.55. The low-refractive-index layer was composed of a cast silicone resin having a thickness of 20 μm and a refractive index of 1.43 (UV 5418A, manufactured by Seiko advance Ltd.). The silicone resin cast had a cavity having a thickness of 15 μm in the area corresponding to a display pattern such that the cavity faced the transparent glass substrate. The resulting low-refractive-index layer consisted of a silicone resin sublayer and an air sublayer.

A first layer and a second layer were formed on the silicone resin layer by screen printing with the ink containing the pigment of titanium oxide used in the display unit 2 as in the preparation of the display unit 2.

The display unit of this example has different refractive indices of 1.55 at the glass substrate, 1.00 at the air layer (the first layer), and 1.43 at the silicone resin layer (the second layer).

A third layer and a shading layer having an aperture pattern were formed thereon as in the preparation of the display unit 2. The display unit 22 having a low-refractive-index layer was thereby completed.

[Preparation of Display Unit 23]

A display unit 23 was prepared as in the preparation of the display unit 2 except that the display unit 23 included a low-refractive-index layer of polyester resin.

A layer of polyester resin was formed on a transparent glass substrate having a thickness of 0.3 mm and a refractive index of 1.55 by screen printing with an ink containing a polyester resin having a refractive index of 1.60 (9007 ink, manufactured by JUJO CHEMICAL CO., LTD., Tetron manufactured by the company is used as a thinner.) such that the layer of polyester resin had a thickness of 25 μm. The display unit 23 was prepared as in the preparation of the display unit 21.

[Measurement of Refractive Index]

In order to measure the refractive index of each layer, a sample layer with the same thickness was prepared and the refractive index of the sample layer was measured with a spectroscopic ellipsometer (M-2000, manufactured by J. A. Woollam Japan) at 23° C. The results are shown in Table 3.

TABLE 3

| Display unit | Substrate Material | Refractive index | Low-refractive-index layer Material | Refractive index |
|---|---|---|---|---|
| 2 | Glass | 1.55 | None | — |
| 21 | Glass | 1.55 | Fluororesin | 1.38 |
| 22 | Glass | 1.55 | First sublayer: air | 1.00 |
|   |       |      | Second sublayer: silicone resin | 1.43 |
| 23 | Glass | 1.55 | Polyester resin | 1.60 |

Table 3 shows that the low-refractive-index layer of fluororesin in the display unit 21 and the low-refractive-index layer of an air in the display unit 22 have a lower refractive index than that of the substrate.

<<Preparation of Display Device>>

Display devices 21 to 24 were respectively prepared by bonding the light-emitting surfaces of the light source units to the shading layers having an aperture pattern of the display unit 2 prepared in Example 1 and the display units 21 to 23, as shown in Table 4. The light-emitting area of each light source unit was at least 500 μm wider than the aperture pattern.

These display devices were evaluated for the light blurring in a lighted state, the appearance in an unlighted state, and the display brightness in a lighted state as in Example 1. The results are shown in Table 4. The brightness of each of the display devices in a lighted state was represented by a relative value based on the brightness "100" of the display device 17 of Example 1.

TABLE 4

| Display device No. | Display unit No. | Display unit Material for low-refractive-index layer | Light source unit Light No. condenser | Brightness in lighted state (Relative) | Appearance in unlighted state | Light blurring in lighted state (nm) | Evaluation | Note |
|---|---|---|---|---|---|---|---|---|
| 21 | 2 | None | 1 Prism sheet | 112 | ○ | 2.0 | B | Inventive |
| 22 | 21 | Fluororesin |  | 115 | ○ | 0.5 | A | Inventive |
| 23 | 22 | Firstlayer: air Second sublayer: silicon resin |  | 120 | ○ | 0.2 | A | Inventive |
| 24 | 23 | Polyester resin |  | 112 | ○ | 1.9 | B | Inventive |

Table 4 shows that the display devices 22 and 23 including a low-refractive-index layer having a lower refractive index than that of the transparent substrate between the transparent substrate and the first layer have high brightness and reduced light blurring in a lighted state in the present invention.

INDUSTRIAL APPLICABILITY

The display device of the present invention is a high-quality display device generating a light-emitting pattern with reduced light blurring and can be applied to portable information devices, such as smart phones, PDAs, and tablet devices.

REFERENCE SIGNS LIST

B transparent substrate
1 low-refractive-index layer
2 light scatterers
3 first layer
4 second layer
5 shading layer having aperture pattern
6 third layer
7 light source
8 aperture pattern in shading layer
9 shading area in shading layer having aperture pattern
10 prism sheet
11 louver film
12 LED light source
13 light-guiding plate
14 holding plate
15 aperture pattern
16 light blurring
17 blurring width

The invention claimed is:
1. A display device comprising, in sequence:
a transparent substrate;
a first layer containing light scatterers;
a second layer containing light scatterers in a lower content than that of the first layer;
a shading layer having an aperture pattern; and a light source having a light-emitting area equal to or wider than the aperture pattern, wherein the first layer has a light scatterer content in the range of 30 to 90 vol % and a thickness in the range of 3 to 15 µm.

2. The display device according to claim 1, wherein the second layer has a greater thickness than that of the first layer.

3. The display device according to claim 1, wherein the first layer contains light scatterers having a volume average particle diameter in the range of 100 nm to 15 µm.

4. The display device according to claim 1, wherein the light scatterer content in the first layer is at least 1.2 times the light scatterer content in the second layer.

5. The display device according to claim 1, wherein a low-refractive-index layer having a lower refractive index than that of the transparent substrate is disposed between the transparent substrate and the first layer.

6. The display device according to claim 5, wherein the low-refractive-index layer has a refractive index in the range of 1.0 to 1.5.

7. The display device according to claim 5, wherein the low-refractive-index layer comprises a resin layer.

8. The display device according to claim 5, wherein the low-refractive-index layer comprises an air layer.

9. The display device according to claim 1, wherein the light source is provided with a prism sheet.

10. The display device according to claim 1, wherein the light source is provided with a louver layer.

* * * * *